(12) United States Patent
Vinden et al.

(10) Patent No.: US 7,930,118 B2
(45) Date of Patent: Apr. 19, 2011

(54) ELECTRICITY ENERGY MONITOR

(76) Inventors: Jonathan Philip Vinden, Mississauga (CA); John Alan Gibson, Richmond Hill (CA)

( * ) Notice: Subject to any disclaimer, the term of this patent is extended or adjusted under 35 U.S.C. 154(b) by 516 days.

(21) Appl. No.: 11/761,452

(22) Filed: Jun. 12, 2007

(65) Prior Publication Data
US 2009/0079416 A1 Mar. 26, 2009

(51) Int. Cl.
*G06F 19/00* (2006.01)
(52) U.S. Cl. .......................................................... 702/64
(58) Field of Classification Search .......... 702/182–185, 702/188; 324/500; 705/63
See application file for complete search history.

(56) References Cited

U.S. PATENT DOCUMENTS

| | | | |
|---|---|---|---|
| 4,804,957 A * | 2/1989 | Selph et al. | 340/870.03 |
| 4,980,794 A | 12/1990 | Engel | |
| 5,539,354 A | 7/1996 | Carsten | |
| 7,493,222 B2 * | 2/2009 | Bruno | 702/64 |

* cited by examiner

*Primary Examiner* — Edward Raymond
(74) *Attorney, Agent, or Firm* — Mark B. Eisen; Dimock Stratton LLP

(57) ABSTRACT

An electric energy monitor or meter for efficient measuring and recording electrical energy usage data relating to a particular appliance or circuit. One embodiment comprises a thin-profile monitoring device through which an electrical conductor, for example the normal line cord plug of an appliance or the output wire from a circuit breaker to the load, is inserted. A display may be provided to show the accumulated energy usage. In other embodiments a device of the invention can be installed in a light switch, appliance, plug, or receptacle. Data can also be transmitted by various means to a computing device such as a personal computer or the like. The device of the invention allows for interaction with Internet-based information dissemination or gathering, meter distribution by means of incentive or promotional give-away, and control of energy usage through connection to an energy management system.

31 Claims, 19 Drawing Sheets

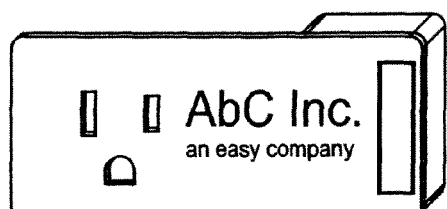
Fig.3a 100
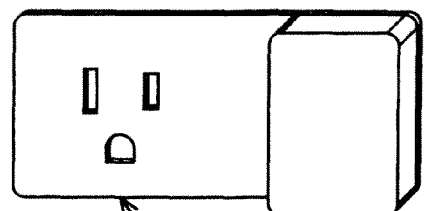
100 Fig.3b
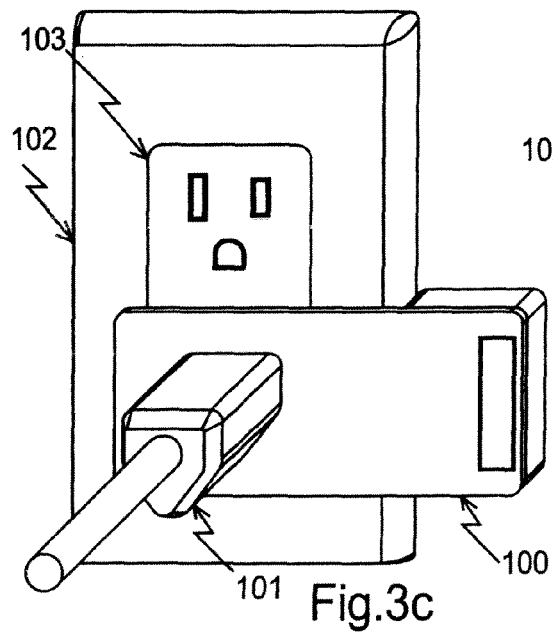
Fig.3c
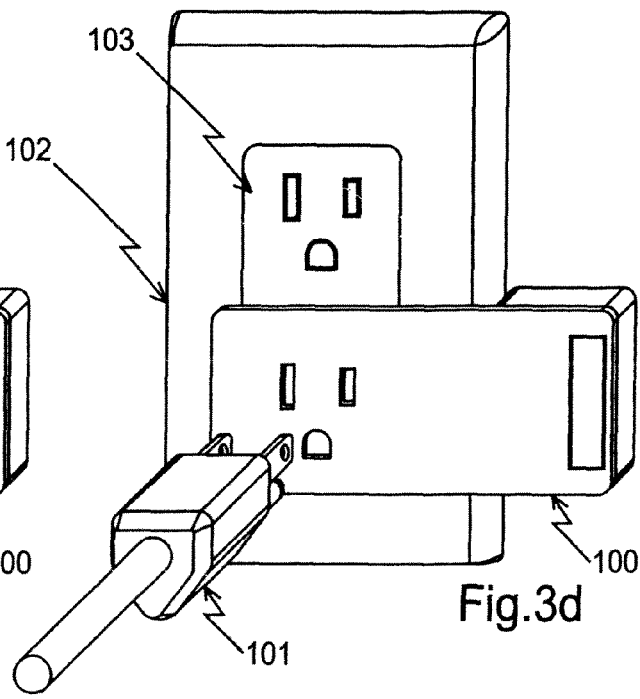
Fig.3d

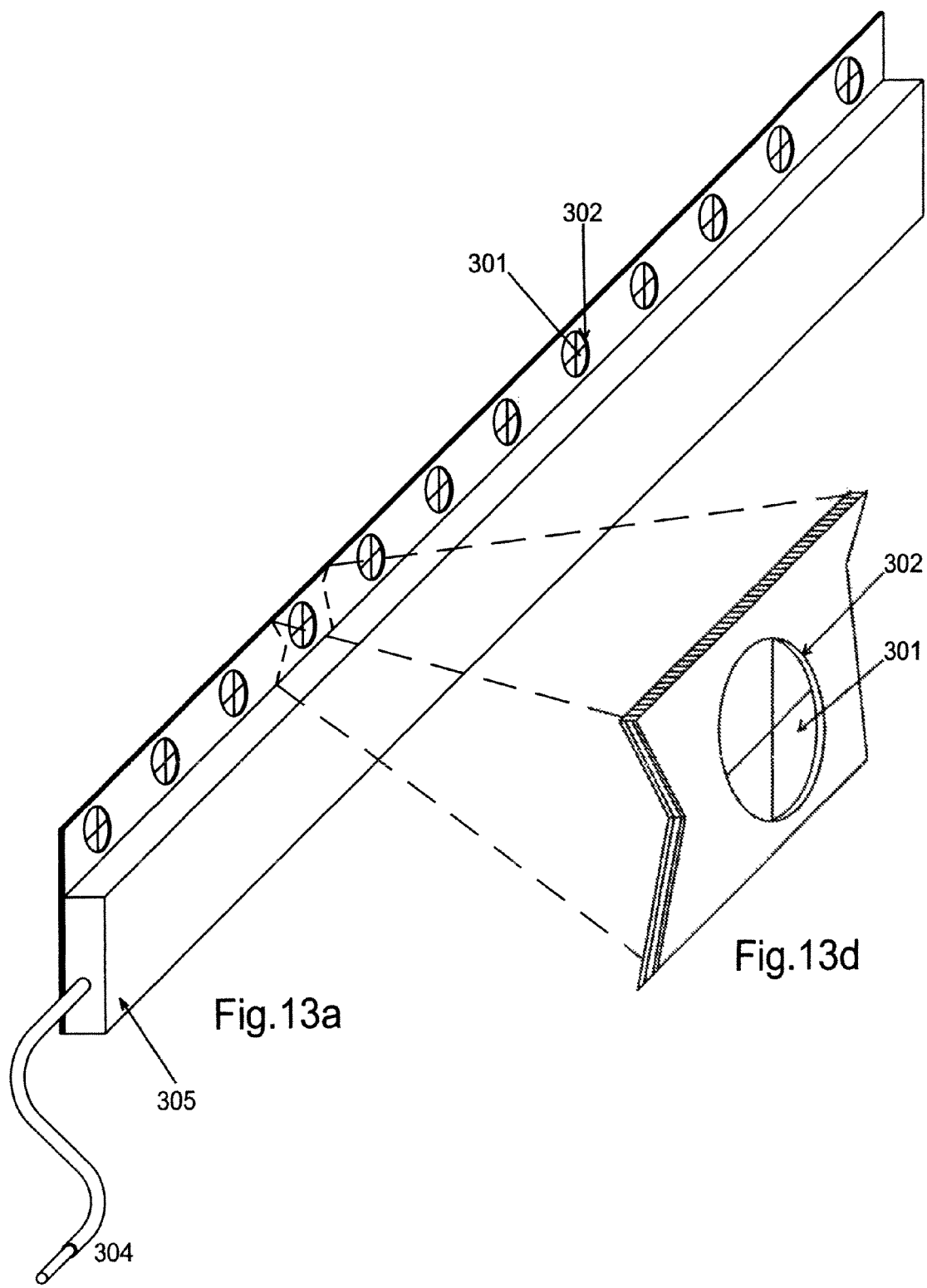

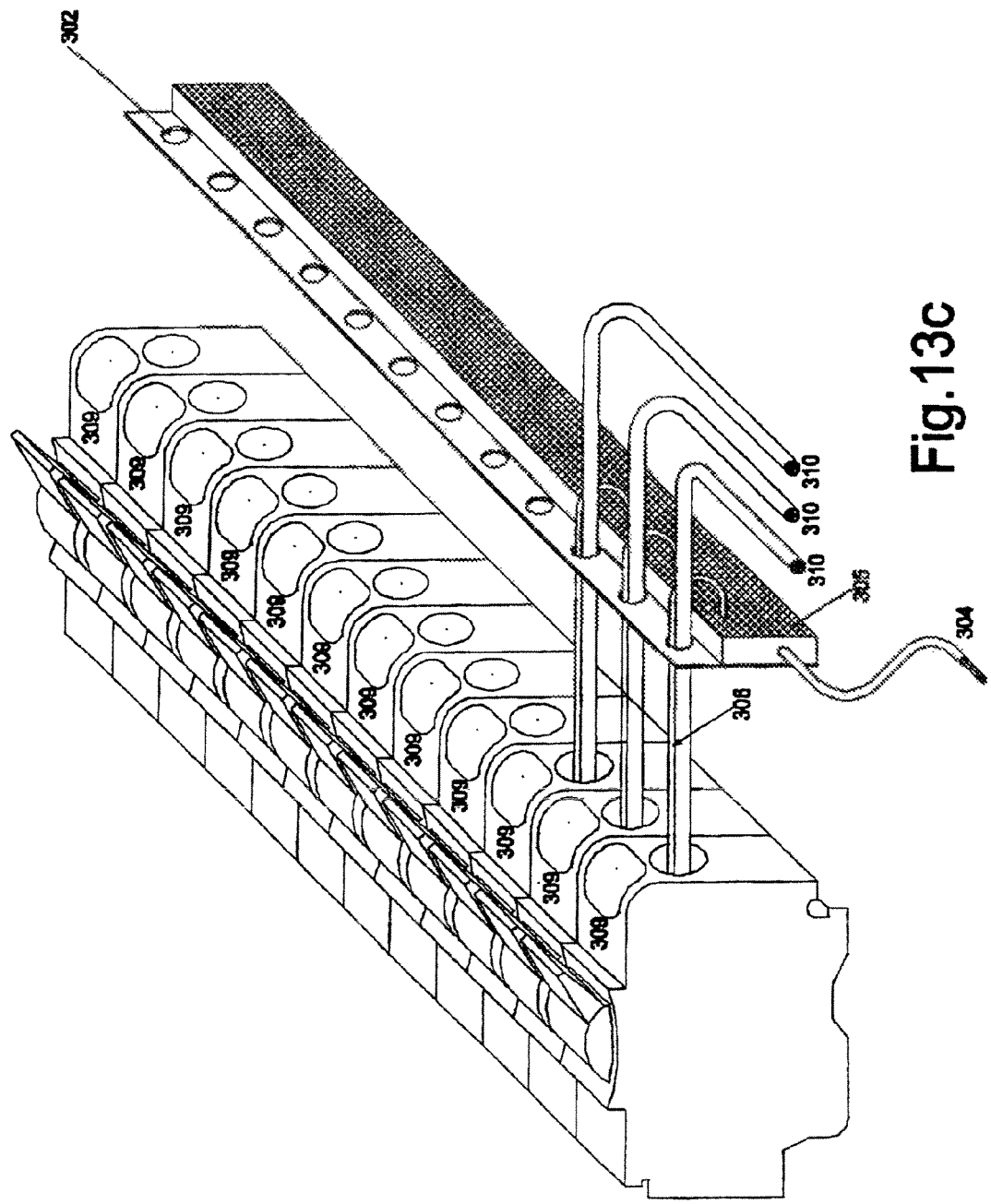

US 7,930,118 B2

ELECTRICITY ENERGY MONITOR

FIELD OF THE INVENTION

The present invention relates to an electric energy monitor for measuring and recording the electrical energy consumed by a load or a group of loads.

BACKGROUND OF THE INVENTION

Measurement and remote display of the amount of energy consumed in a household or commercial establishment has been possible for a considerable time.

Several patents show an implementation that utilizes connection or attachment to the utility electrical power meter. Examples of such patents are: U.S. Pat. No. 4,106,095 to Yarbrough, U.S. Pat. No. 4,207,557 to Gilkeson, U.S. Pat. No. 4,233,590 to Gilkeson and U.S. Pat. No. 4,630,211 to Pettis. Other similar devices that are stand alone energy meters require permanent installation in line or at the distribution box. Examples of such patents are: U.S. Pat. No. 4,080,568 to Funk and U.S. Pat. No. 4,182,983 to Heinrich et al. These methods or devices are only able to measure the total energy consumed at the premises and cannot readily provide a measurement of the consumption of a specific load or group of loads within the premises.

It is well known in the art that devices can be made to measure and record the electrical energy used by an appliance. There are a number of patents which reveal portable plug-in devices which can measure the energy consumption by individual appliances, which provides a feed back that can allow the user to modify their electrical usage behaviour in order to conserve electricity or to use electricity at low-demand times. Examples of such patents are: U.S. Pat. No. 4,120,031 to Kincheloe et al, U.S. Pat. No. 4,253,151 to Bouve, and U.S. Pat. No. 4,901,007 to Sworn. These prior art devices are bulky and expensive, frequently requiring considerable expertise in their implementation and use. Furthermore, the configurations of these prior art devices rely upon a connection being made to the receptacle through suitably sized blade terminals. Connection of the appliance under test to the device relies upon a complete receptacle for the connection of the appliance power cord to the device. Energy flow through the device is thus accomplished with suitably large current connecting, contacting and conducting means necessitating large, bulky and expensive devices.

The bulkiness of these prior art devices makes their use problematic as the existing arrangements, since power connection to the appliance must be altered.

Additionally, the current contact conducting and measurement means consume considerable energy in their operation. A common measuring means is the use of a resistor through which all current passes to generate a voltage signal. Even if this resistor is only a few milliohms, more than 1 watt losses are generated at 10 A load levels. These prior art devices were not designed to be used continuously in circuit, so these losses are not substantive in the short term. However, these losses are significant in the long term, rendering such devices unsuitable for continuous use.

BRIEF DESCRIPTION OF THE DRAWINGS

FIGS. 3a to 3h are schematic perspective views of different configurations of the device being used to monitor power in alternate plug and outlet arrangements.

FIGS. 11a to 11d respectively show an LCD display of volts, amperes, watts and kilowatt-hours.

FIG. 13a is an illustration of a ganged embodiment of the invention for use with circuit breaker panel, fuse box or like.

FIG. 13c is an illustration of an embodiment of FIG. 13a in line with circuit breakers having a wire alternative to galvanic contact.

FIG. 13d is an enlarged view of a galvanic contact in the embodiment of FIG. 10.

DETAILED DESCRIPTION OF THE INVENTION

Figure 1:
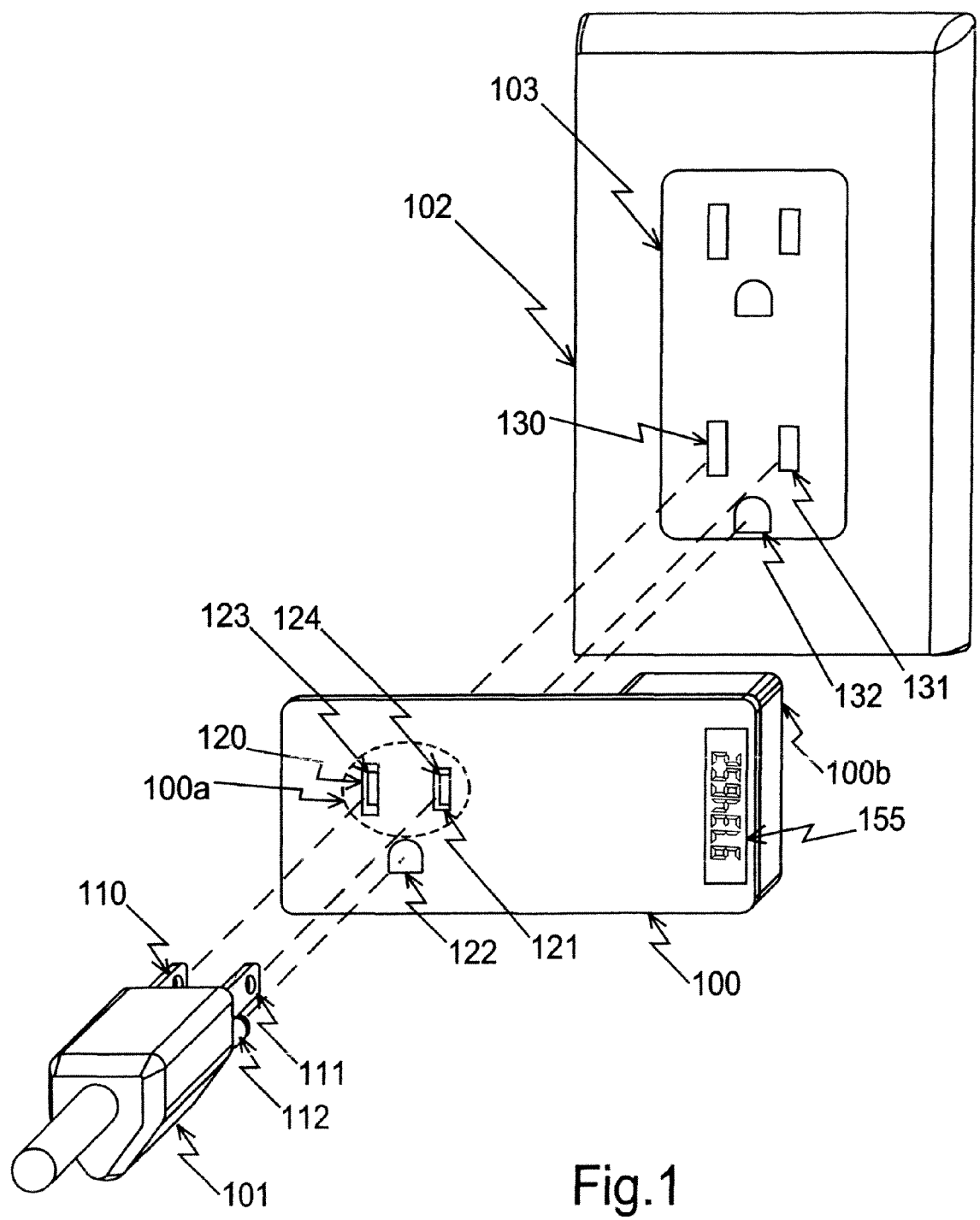
FIG. 1 is a schematic perspective view of a device (module) according to a preferred embodiment of the invention being used to monitor power in a standard power plug in a standard duplex wall outlet.

The present invention can be used continuously without substantially altering the existing arrangements of power connection of ordinary appliances. The invention is simple to use and understand, and operational losses through the use of the invention are minimal.

The invention comprises a thin-profile monitoring device through which an electrical conductor, for example the normal line cord plug of an appliance or the output wire from a switch or circuit breaker, is inserted. In the case of a line cord plug which has load conductors comprising blades 110, 111, the line cord plug is then connected to a power receptacle to run the appliance in the normal manner. In the preferred embodiment display on the device shows the accumulated energy (kilowatt hours) which the appliance (or circuit) has used since installation of the monitor.

Parameters of the power consumption such as the present volts, amps, energy rate, peak rate, total energy etc. may be displayed by indexing through a menu with a pushbutton or by an auto-cycling timer that cycles through a number of measured and/or calculated values. Information collected may be written to a non-volatile data memory for later retrieval. The device may also incorporate a replaceable battery to power the volatile data memory in case of a power outage.

Alternatively, or additionally, a device according to the invention, with or without a display, may transmit energy consumption information to a remote location, via a wireless data link, encoding on the A.C. power lines or direct connection to a remote monitoring device.

In one aspect the invention provides an electric energy monitor device for measuring the electrical energy usage of an electrical load powered by load conductors connected to a power source 113, comprising a body, the body being configured to allow at least one load conductor to pass through at least one opening in the body to couple to the power source 113, at least one current sensor for detecting a level of current, the current sensor being in communication with the load conductor extending through the opening in the body when coupled to the power source 113, a controller for receiving signals from the current sensor, and transmitting data either to a display for displaying data relating to electrical energy usage of the load, or to a remote data processing device for recording data relating to electrical energy usage of the load, or to both.

In further aspects of the invention: the current sensor comprises an electrical coil having at least one complete electrical turn in inductive communication with the load conductor extending through the opening in the body; the device further comprises at least one voltage sensor for detecting a level of voltage between at least two load conductors which have an electrical potential drop representing the voltage drop across the load, wherein the body is configured to allow the at least two load conductors to respectively extend through at least two openings in the body, the load conductors when extending through the at least two openings in the body being in conductive communication with voltage sensing conductors coupled to the voltage sensor, to sense a potential drop across the load; the controller calculates power usage based on the measured level of current and level of voltage drop; the device is for use with a load having a line cord terminating in a plug having blades for connection to an electrical receptacle, wherein the load conductors are coupled to the current sensing conductor and voltage sensing conductors as the blades pass through the body into the electrical receptacle; the device is for use in a power distribution panel, wherein the load conductors are coupled to the current sensing conductor and voltage sensing conductors as the load conductors pass through the body to a terminal of a circuit breaker or fuse; the load conductors are coupled to the current sensing conductor and voltage sensing conductors as the load conductors pass through the body to a switch; the body is configured as a cover plate for the receptacle; the body is configured as a cover plate for the switch box; the body is configured to be contained within the plug of the line cord; the body is configured to be contained within a receptacle of an electrical power outlet to the load; a space within the coil of the current sensor is filled with a ferromagnetic material or non-ferromagnetic material; the current sensor operates using the Hall Effect; the current sensor operates using a ferro-resistive principle; the current sensor operates using a ferro-capacitive principle; the current sensor comprises a fluxgate sensor; the voltage sensor is coupled to the load conductors by galvanic contacts; the voltage sensor is capacitively coupled to the load conductors; the display means is integral to the device; the display is located remotely from the device; the display comprises more than one remote display element; the display comprises an integral display element and at least one remote display element; the device is for a multi-phase load having N phases and N conductors wherein the device comprises N−1 current sensors; the device is for a multi-phase load having N phases and N conductors wherein the device comprises N−1 voltage sensing conductors; the device is for a multi-phase load having N phases and N+1 conductors wherein the device comprises N current sensors; the device is for a multi-phase load having N phases and N+1 conductors wherein the device comprises N voltage sensing conductors; either the time the device is powered or the time that a load characteristic such as current exceeds some preset minimum, or both, is monitored and displayed; and/or at least one energy usage characteristic is recorded in non-volatile memory.

In a further aspect the invention provides a current monitoring device for measuring a current drawn by an electrical load powered by load conductors connected to a power source 113, comprising a body, the body being configured to allow at least one load conductor to pass through at least one opening in the body to couple to the power source 113, at least one current sensor for detecting a level of current, the current sensor being in communication with the load conductor extending through the opening in the body when coupled to the power source 113, a controller for receiving signals from the current sensor, and transmitting data either to a display for displaying data relating to current drawn by the load, or to a remote data processing device for recording data relating to current drawn by the load, or to both.

In a further aspect the invention provides a voltage monitoring device for measuring a voltage of an electrical load powered by load conductors connected to a power source 113, comprising a body, the body being configured to allow at least one load conductor to pass through at least one opening in the body to couple to the power source 113, at least one voltage sensor for detecting a level of voltage between at least two load conductors which have an electrical potential drop representing the voltage drop across the load, wherein the body is configured to allow the at least two load conductors to respectively extend through at least two openings in the body, the load conductors when extending through the at least two openings in the body being in conductive communication with voltage sensing conductors coupled to the voltage sensor, to sense a potential drop across the load, and a controller for receiving signals from the voltage sensor, and transmitting data either to a display for displaying data relating to the voltage of the load, or to a remote data processing device for recording data relating to the voltage of the load, or to both.

In a further aspect the invention provides a method of measuring electric power via a device comprising a body, the body being configured to allow at least one load conductor to pass through at least one opening in the body to couple to the power source 113 and a current sensor for detecting a level of current, the current sensor being in communication with the load conductor extending through the opening in the body when coupled to the power source 113, comprising the steps of: a. passing at least one load conductor through the body to the power source 113, b. receiving signals from the current sensor, and c. transmitting data either to a display for displaying data relating to electrical energy usage of the load, or to a remote data processing device for recording data relating to electrical energy usage of the load, or to both.

In a further aspect the invention provides a method of monitoring electrical power at a user's premises, comprising the steps of: a. measuring power usage at the user's premises; and b. transmitting data relating to the power usage to a remote administrator; whereby power usage or the power supply at the user's premises, or both, can be modified based on the information transmitted to the administrator. This aspect may further include the step if transmitting data to the user relating to power usage at the user's premises.

Figure 8:
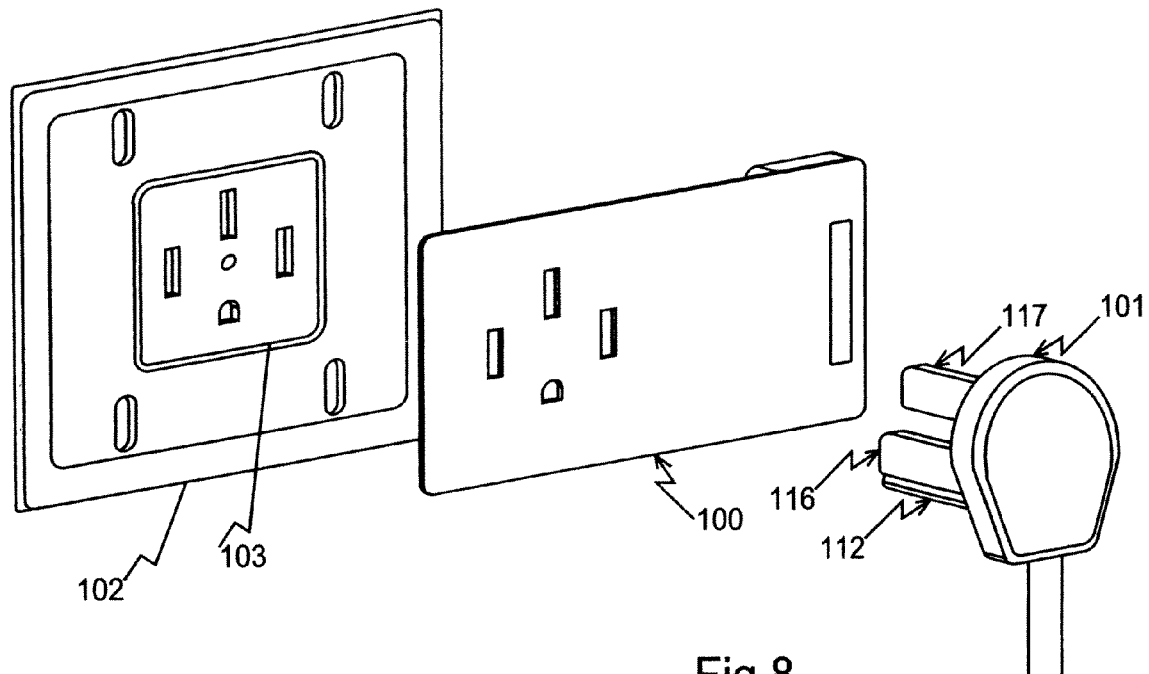
FIG. 8 is a schematic perspective view of an embodiment of the device for an electric range plug.
Figure 9:
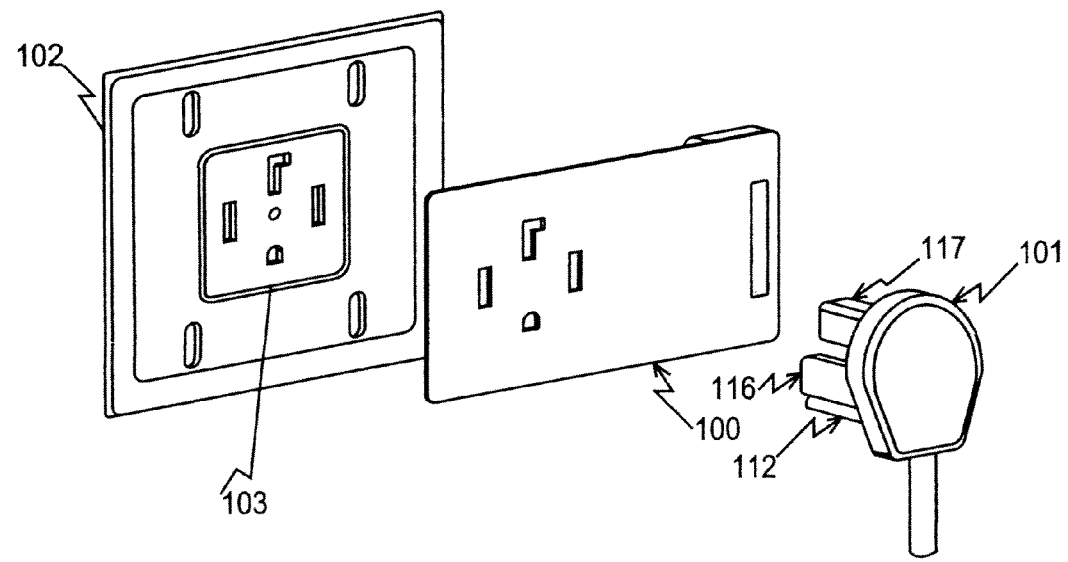
FIG. 9 is a schematic perspective view of an embodiment of the device design for an electric dryer plug.

Referring to the embodiments of the device illustrated in FIGS. 1, 8 and 9, the electrical load 114, 118 may be any type of load that could be connected via a power cord. This may for example include (but is not-be limited to) a table or floor lamp (torchiere) toaster, kettle, hot plate, refrigerator, dish washer, hair dryer, portable room heater, computer, battery charger, electric tools, washing machine, clothes dryer or stove (with appropriate change in configuration for this plug type), or any other electrical load or device. Furthermore, merely by using a multiplier or an extension cord with multiple receptacles, a group of such loads can be monitored in like fashion, as described below.

The supply for the electronics may be arranged to limit the current in the conductors outside the shadow of the plug footprint to levels lower than the leakage currents allowed by approval authorities, thus making the device safe for general use.

In one embodiment the device may display merely information regarding kilowatt-hours of energy consumption, for example in $1/100^{th}$ of a kilowatt-hour increments since installation (or reset). The module illustrated has a display limit of 9,999.99 kilowatt-hours which rolls over to zero. In one embodiment, if the module is depowered the counter resets to zero. Other embodiments can write the usage data to non-volatile memory as a means of retaining the information even during power interruption, so that the total consumption since reset remains stored in the module and continues to accumulate through brownout and blackout intervals.

The module may also incorporate a reset means to return the information to zero. The reset means may consist of (but is not-be limited to): removal of a backup battery, manual reset pushbutton or switch, magnetically operated switch, contacts on the device being short-circuited, contacts on the device being powered, contacts on the device receiving a reset code (for example an X-10 type protocol code transmitted via the power lines), an optical receiver associated with the device receiving a reset code, or a radio frequency antenna (such as used for merchandise security) receiving a reset code transmitting a reset code via programmed "on" and "off" switching sequence of a load.

The device can be programmed to cycle through a number of measured and/or calculated values with, for example, a total cycle time of 4.1 seconds with the cycle dwell time as shown below. The value displayed would be the immediate present level. These displayed parameters could for example include (but are not-be limited to): display for 0.7 second Volts as FIG. 11a; display for 0.7 second Amperes as FIG. 11b; display for 0.7 second Watts as FIG. 11c; display for 2.0 seconds Kilowatt-hours as FIG. 11d.

The display cycle could be activated by pushbutton. Upon activation the display would cycle through the selected display parameters. Alternately, the display may be indexed through by means of pushbutton. This embodiment may also incorporate a timer that would return the unit to displaying kilowatt-hours after a preset amount of time had elapsed. This pushbutton function could be replaced by other means such as a magnetically operated switch or an optically operated switch.

The display may also be arranged to show a several values simultaneously by having additional display lines or icons. Each module could also have a unique, preprogrammed serial number that would be displayed under appropriate conditions (for example, upon power-up or reset). Calculated values could include the cost of electricity used to date at say 10¢ per kilowatt-hour. In an embodiment in which the device is programmed with a date/time, the total cost of electricity to date could be calculated under a variable rate costing regime.

FIG. 1 illustrates a device in the form of a module 100 according to an embodiment of the invention, for use with a load 114 such as an appliance or electrical device having a power cord 101. The (male) blades 110, 111 and 112 of the plug or 'cap' of the power cord 101 are inserted through complementary openings such as slots 120, 121 and 122 respectively of module 100, and then the assembly of power cord 101 and module 100 is inserted into wall receptacle 103 with blades 110, 111 and 112 of 101 conventionally coupling respectively into female receptacles 130, 131 and 132 of, for example, a standard duplex wall receptacle 103 as shown.

The thinness of the body of the module 100 in the zone that accepts the plug 101 of the line power cord ensures that the use of one of such module 100 does not hamper the normal function of the line cord 101 in receptacle 103, nor it does its use cause a safety hazard. This thin profile of the body of the module 100 can be accomplished by using thin profile contacts 123 and 124, which as shown FIGS. 2a and 2c extend into the region defined by the slots 120 and 121 of module 100 to make galvanic contact with blades 110 and 111. The module further incorporates current measurement circuitry having a very slim profile, the preferred embodiment of which is described below.

The preferred embodiment of a device according to the invention consist of three principal parts: first, a pair of contacts 123, 124 to make galvanic connection to a phase of the power supply (e.g. load conductors such as blades 110, 111 of line cord 101), thus enabling the functions of measuring the voltage and additionally providing power for the electronic circuit and display; second, a current sensor for measuring the current passing through blade 110 and a voltage sensor for measuring the voltage drop across blades 110 and 111; and third, an electronic circuit and LCD display for computing and displaying the energy consumed by an appliance connected by the line power cord 101. However, embodiments of the invention which measure only current or voltage, or which do not display electrical usage parameters but instead transmit data to a remote location, are contemplated and within the scope of the invention.

The invention will be described in detail in relation to the embodiment illustrated in FIG. 2a, for a standard 120 Volt duplex wall receptacle such as that illustrated in FIG. 1. The manner in which the invention may be implemented in other configurations, some of which are described herein by way of non-limiting example, will then be apparent to those skilled in the art.

The body of the module 100 comprises a load conductor-engaging portion 100a containing the slots 120, 121 and contacts 123, 124; and a display-containing portion 100b.

The conductor-engaging portion 100a may comprise five layers:

1. Outer covering insulating layer 161 of glass reinforced epoxy approximately 0.007 inches thick
2. Outer intermediate spacer layer 162 of glass reinforced epoxy approximately 0.007 inches thick. Outer intermediate spacer layer 162 comprises a slot 127 for inductor 168, and elongations 128, 129 of slots 120 and 121.
3. Conducting layer 163 of copper approximately 0.001 inches thick. The conducting layer 163 may be laminated onto layer 164 and etched off in a conventional printed wiring board method.
4. Inner intermediate spacer layer 164 of glass reinforced epoxy approximately 0.007 inches thick. Inner intermediate spacer layer 164 comprises a slot 137 for inductor 168.
5. Inner covering insulating layer 165 of glass reinforced epoxy approximately 0.007 inches thick.

These layers may themselves consist of laminations of materials suitable for the purpose of the layer. For example, layers 161 and 162 could be laminates of two thicknesses of 0.002 inch polyester film with 0.0005 inch thick binder. This would make the overall assembly profile thinner while still maintaining adequate insulation levels to meet safety requirements.

The layers 161, 162, 163, 164 and 165 may extend through the display-containing portion 100b, which preferably also comprises an epoxy case 150 which may for example be molded onto the end on the display side. The case is shown as about 0.25 inches thick, which is comparable to the thickness of a standard wall plate 102 so that the back of case 150 will rest flush against the wall when this particular embodiment of the module 100 is in its operating environment.

The case 150 houses the display 155 and the circuit board 151 to mount electronic components required to sensibly drive the display. Many variations of case 150 and materials could be used to house the electronic components. Suitable insulating materials for the case could be polyethylene, polycarbonate, styrene or the like and the case need not be molded on but could be snap-on, attached with fasteners or glued on. Additionally the case could be metal with adequate clearance/insulation to the conducting components.

A long life battery (not shown) may optionally be provided as an alternative (or backup) power supply for the circuitry.

The module 100 is preferably provided with a current sensor comprising an inductor 168. A single current sensor is sufficient for a single phase load. For a multi-phase load having N phases, N−1 current sensors can be used to measure the current directly and the current through the un-monitored phase can be derived from the current flowing through the other phase(s) in known fashion.

Within layers 162 and 164 are slots 127 and 137 respectively. When the layers are assembled, these slots form an interior cavity or pocket 167 into which the inductor 168 may be installed as a current sensor. The inductor consists of coil 169 of wire of approximately 100 turns of #42AWG. This coil is wrapped over an insulator 170 of polyester 0.0005 inches thick atop a core 171 of silicon steel 0.75 inches long by 0.125 inches wide by 0.010 inches thick. In order to measure the current through blade 110, pocket 167 is located symmetrically about slot 120 at an approximate distance of 0.220 inches centerline of pocket 167 to centerline of slot 120 on the side of slot 120 opposite to slot 121. The inductor 168 is preferably on the side of the blade slot 120 opposite from the other flat blade slot 121, and should be as close as practical to the slot 120 without contacting the blade 110.

The pocket and inductor assembly may be of any desired length, and could be curved or otherwise shaped to improve the linearity of the signal pickup of the current. Many variations of the size and shape of the current sensor (including a toroid) are possible, as can be readily designed by those skilled in the art. The two ends of the wire of the coil 172 and 173 are attached to conductor strips 174 and 175 which transmit the signal to the measuring electronics.

Figure 4:
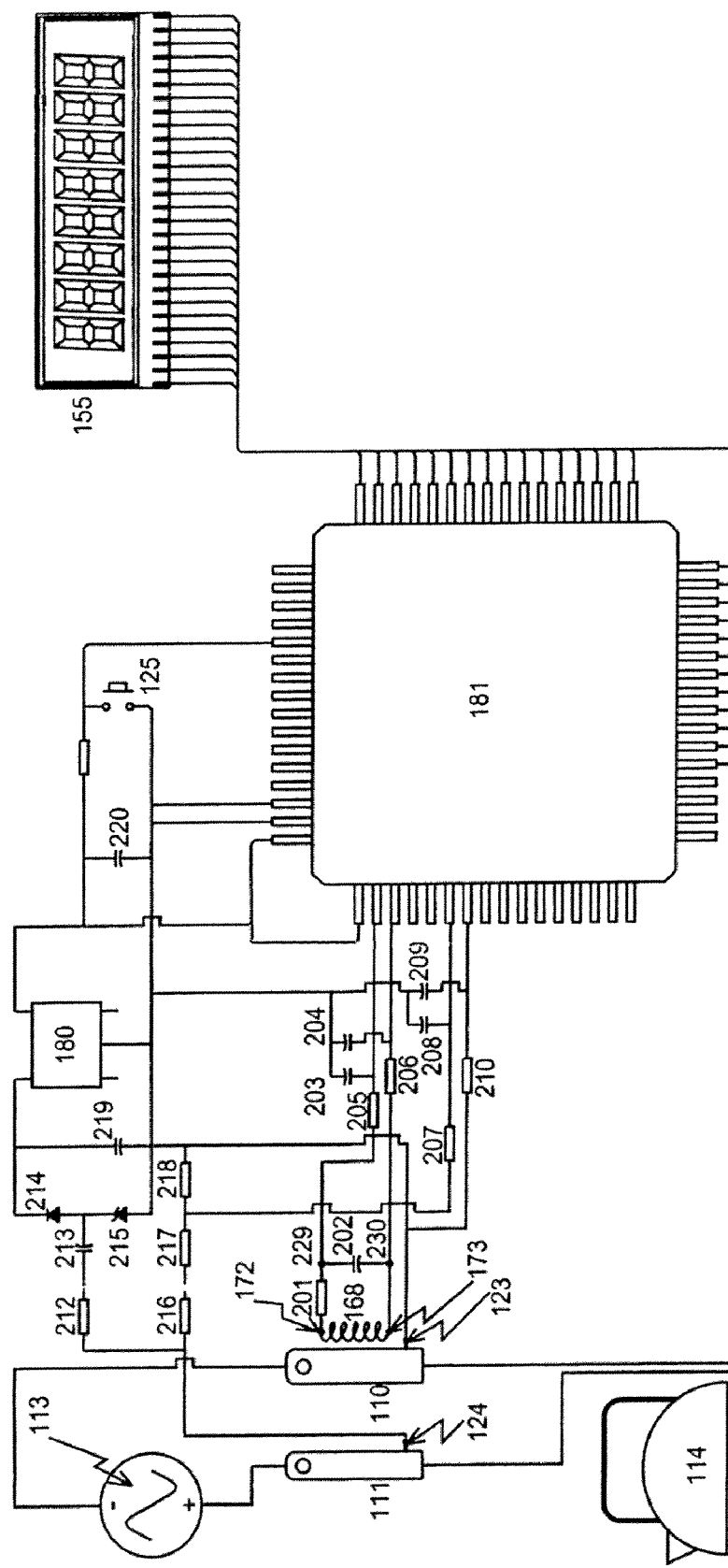
FIG. 4 is an electrical circuit schematic of an embodiment of the invention utilizing a microcontroller to convert the signals received from the sensors to displayed information, including connections to a power supply (utility) and an electrical load.

In operation, inductor 168 is in inductive communication with the blade 110 of plug 101, and as such is exposed to the magnetic flux lines emanating from the current flowing in blade 110. These flux lines generate a voltage at nodes 172 and 173 of the coil 169 which is the first derivative of the current in blade 110. Referring to FIG. 4, the interaction of an integrator circuit resistor 201 and capacitor 202 makes the voltage between node 229 and node 230 a direct function of current. A signal representing the voltage between node 229 and node 230 is provided to microcontroller 181 through RC filter 205, 203 and RC filter 204, 206 for measuring the current.

This measurement uses virtually no power (measurement of the power used at 10 amperes through blade 110 yields 18 microamperes at 5 volts which equals 90 microwatts).

If a precise measurement of energy usage is not required, power may be calculated from the current alone using an inferred level of voltage, for example the nominal voltage of the connected power supply system. However, in the preferred embodiment voltage monitoring may be provided by voltage sensing conductors coupled to the voltage sensor, to sense the potential drop across at least two load conductors which have the electrical potential drop across the load. For example, galvanic contact 123 is positioned in conductive communication with wide blade when the blade is inserted through the body of the module 100, and galvanic contact 124 is positioned in conductive communication with narrow blade when the blade is inserted through the body of the module 100, to provide a voltage signal through divider resistor string 216, 217, and 218 via RC filters 207 208 and 210, 209 to microcontroller 181.

Figure 2A:
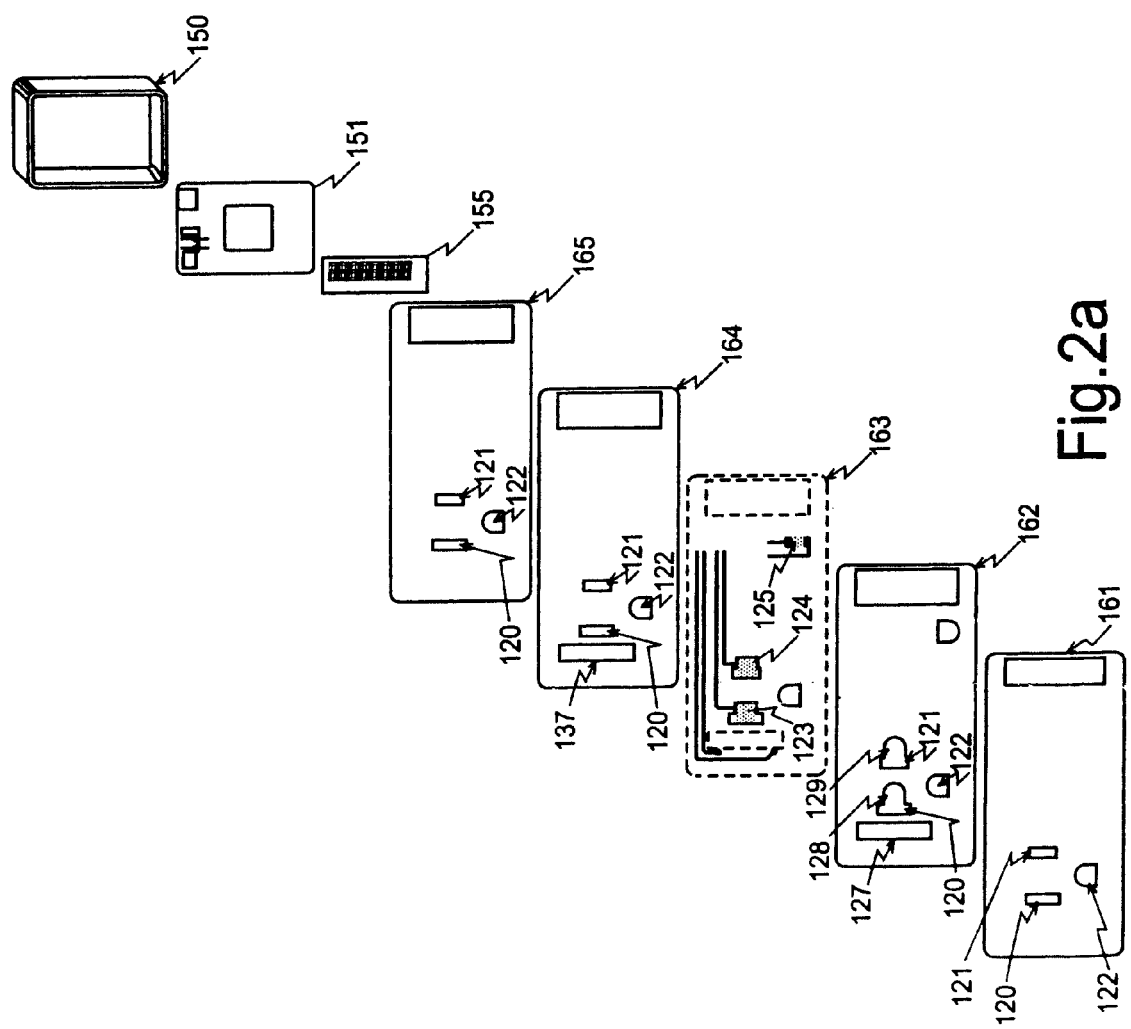
FIG. 2a is an exploded view of the device of FIG. 1 showing various layers of the body of the device.
Figure 2B:
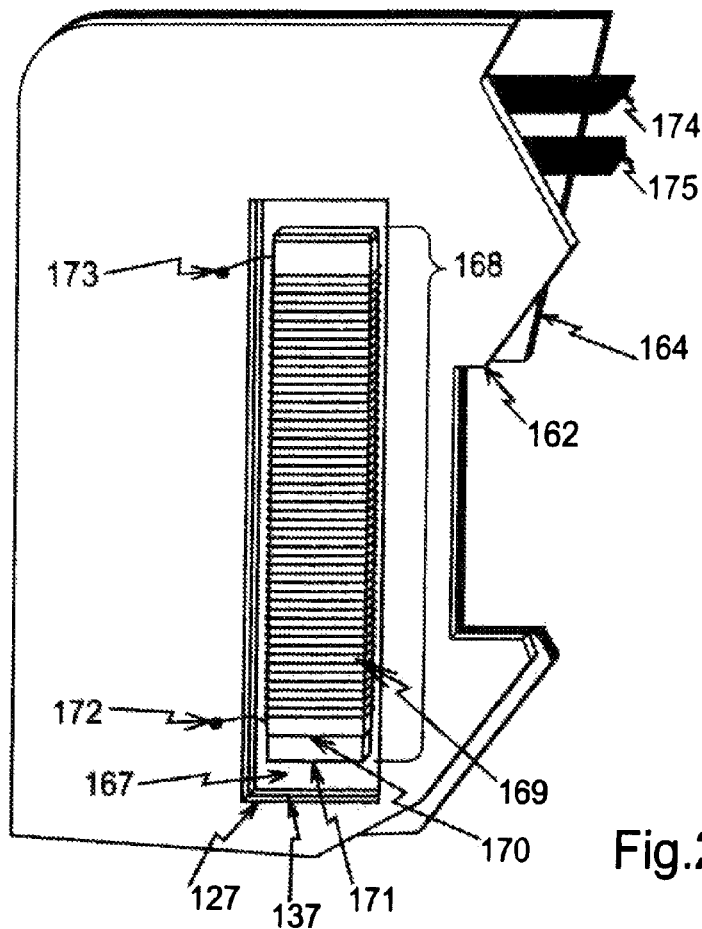
FIG. 2b is an enlarged cutaway view of FIG. 1 showing a current sensing inductor.
Figure 2C:
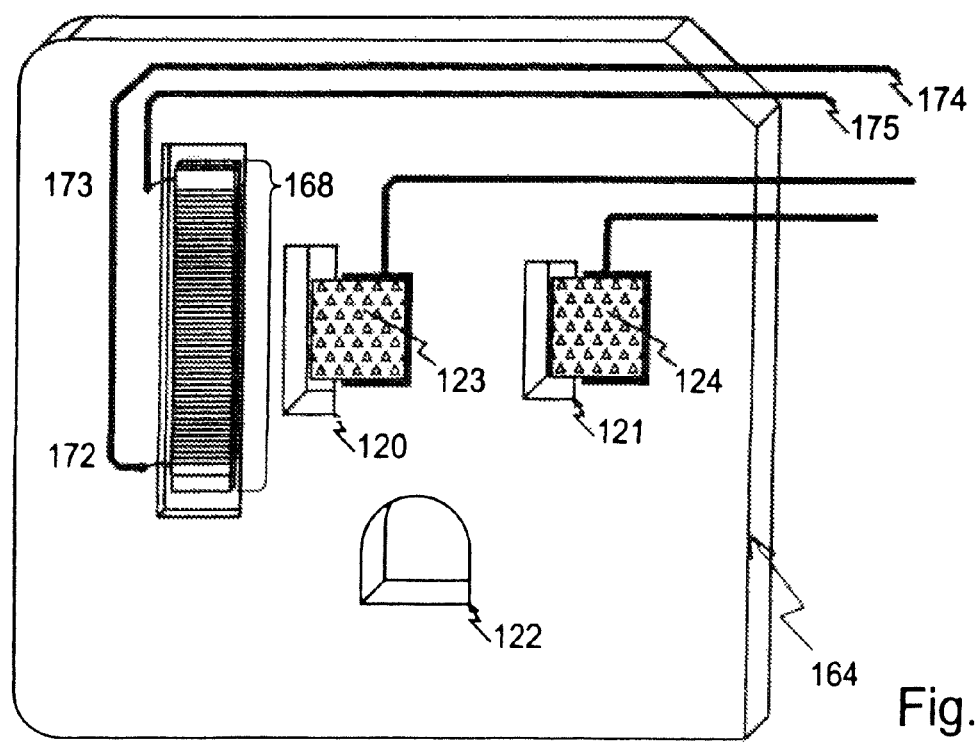
FIG. 2c is an enlarged cutaway view of FIG. 1 showing the galvanic contacts.

As can be seen in FIGS. 2a and 2b, conducting layer 163 is sandwiched between layer 162 and spacer layer 164 but does not extend to the edge of the body. This conducting layer 163, which may comprise only contacts 123, 124, conducting traces, and optionally a pushbutton 125, is arranged with insulating spacing between adjacent conducting traces in the conventional manner of printed wiring boards and may be fabricated using well known fabrication methods. Some conducting traces, or thin metallic additions 123 and 124 (for example, 0.005 inch thick brass) to these conducting traces, are allowed to extend respectively into the areas defined by the slots 120 and 121 in the layer 164. These extensions are sufficiently into the area of slots 120 and 121 that when blades 110 and 111 of plug 101 are inserted into slots 120, 121, electrical galvanic contact is made on the sides of the blades 110, 111. (The extension of the conducting traces is sufficient to make contact with the blades 110, 111 but not so far into the area of slots 120 and 121 that the conducting trace extensions will be deformed when the blades are inserted in the finished assembly.)

Many variations of the galvanic contacts are possible and may include multi-pronged foil on one or more sides (or edges) of the blades, a coil spring around the blade, or on one or more sides of the blade using conductors or semiconductors to make the galvanic contact structure For the voltage sensor two contacts are required for a single phase load. For a multi-phase load having N phases, N−1 contacts can be used to measure the voltage drop directly between all but one phase, and the voltage drop across the un-measured phase can be derived from the voltage measured across the other phases in known fashion. It will be appreciated that the invention can alternatively be implemented in a voltage monitoring device, without requiring a current sensor.

Figure 10:
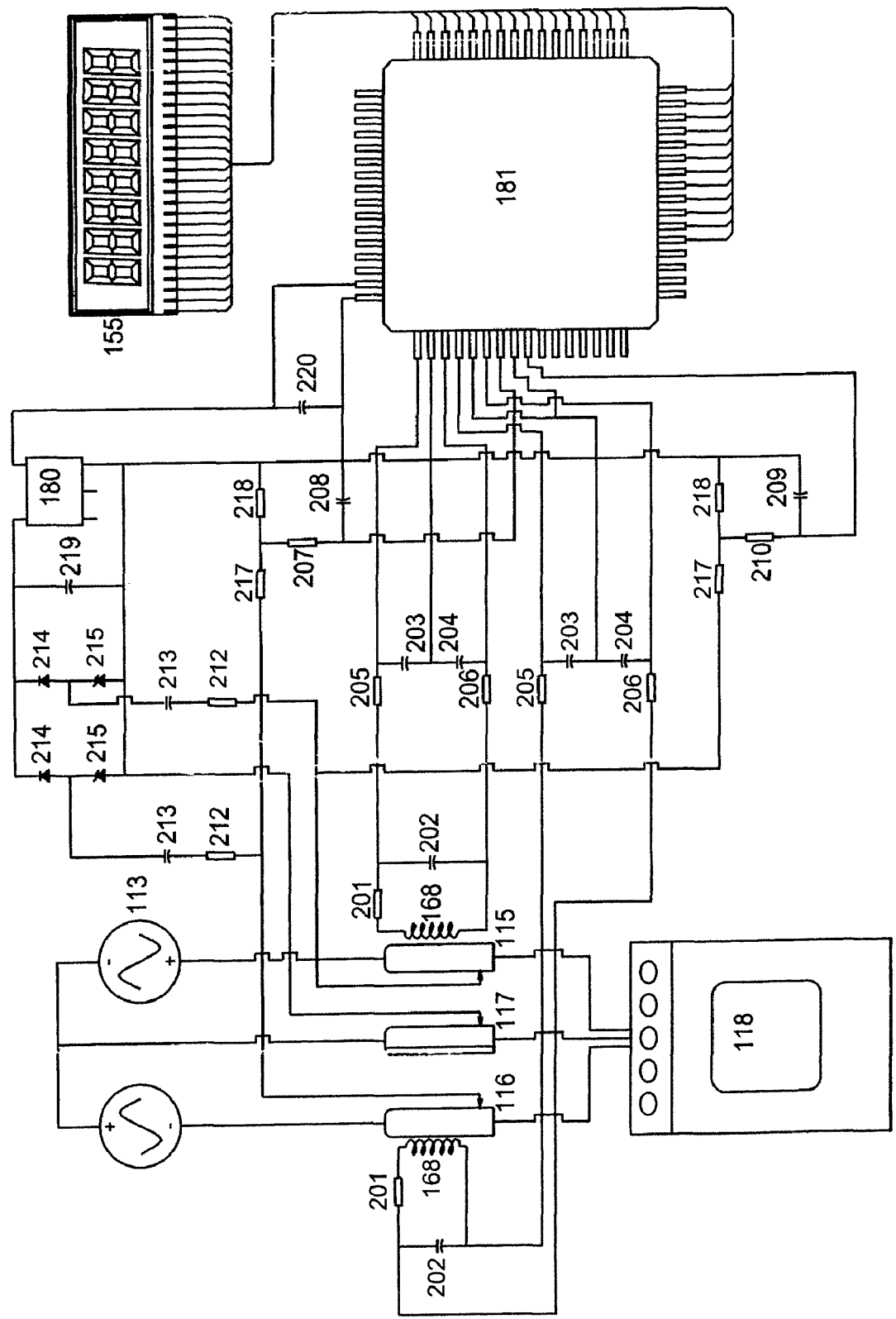
FIG. 10 is an electrical circuit diagram for the embodiment of the device for the plug of a multi-phase appliance such as a range or dryer.

As shown in FIGS. 4 and 10, the microcontroller 181 is powered through power supply made up of components resistor 212, capacitor 213, diodes 214, 215, capacitor 219, voltage regulator 180, and capacitor 220. With suitable software loaded into microcontroller 181, as will be known to those skilled in the art, the voltage and current signals will be processed to drive display 155. FIG. 65 illustrates an embodiment of the invention using an application-specific integrated circuit (ASIC) 182. In either case an optional pushbutton 125 may be operated through outer insulating layer 161. Pushbutton 125 can enable display changes, reset, cost programming, etc. depending on programming and the number of times it is depressed.

Figure 7:
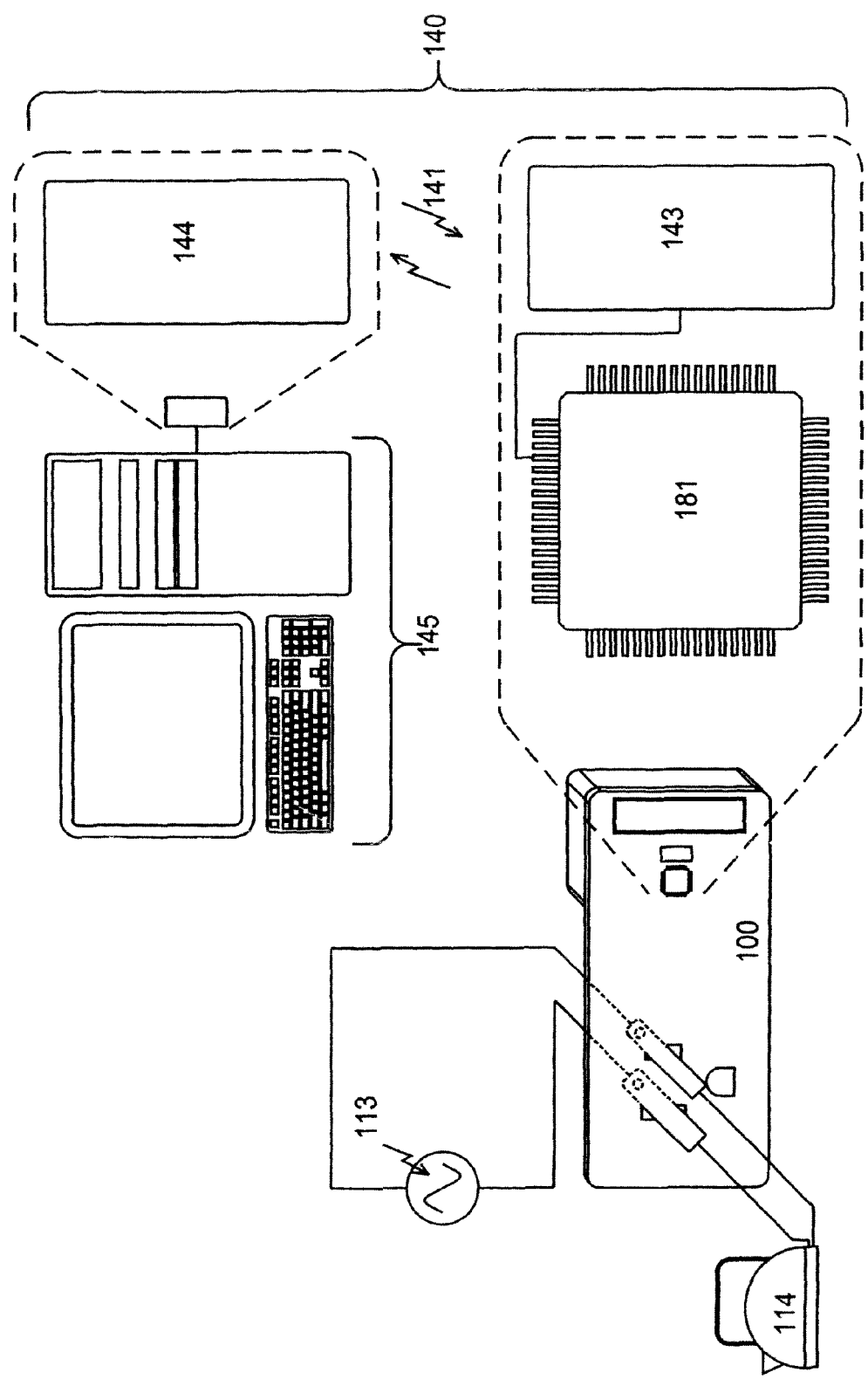
FIG. 7 is a block diagram showing the circuit of FIG. 4 incorporating communication circuitry for transmitting data to a remote location.

FIG. 7 illustrates the circuit of FIG. 4 incorporating communication circuitry, for transmitting data to a remote location. Communication may be wired or wireless, and according to any suitable protocol including Internet protocol and standard wireless systems including (without limitation) long-range systems such as RF or short-range systems such as Bluetooth (trademark). FIGS. 8 to 10 illustrate embodiments of the invention suitable for use with multi-phase loads 118, such as electric ranges and dryers with (male) blades 115, 116, 117 and 112 and may optionally incorporate similar communication circuitry.

Figure 12A:
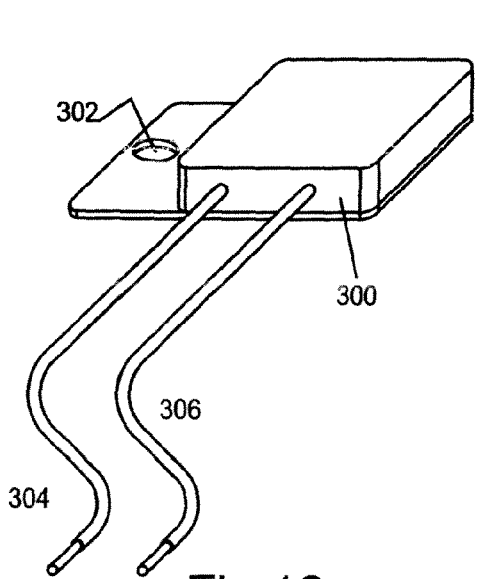
FIGS. 12a and 12b are respectively front a rear perspective views of an embodiment of the invention for use with a switch, circuit breaker or other electrical device having a line wire.
Figure 12B:
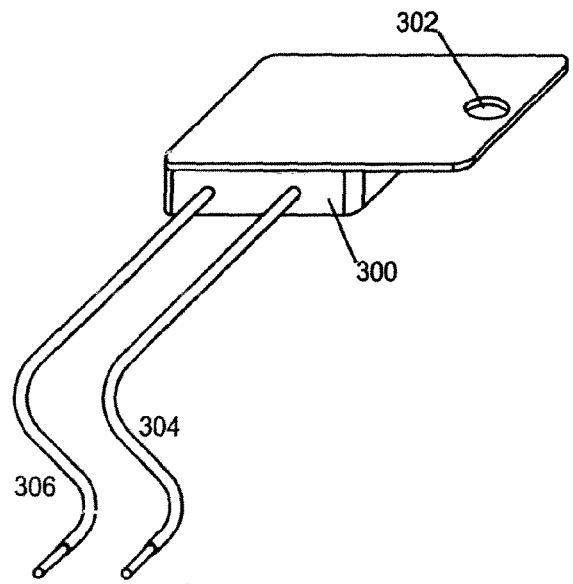
Figure 13B:
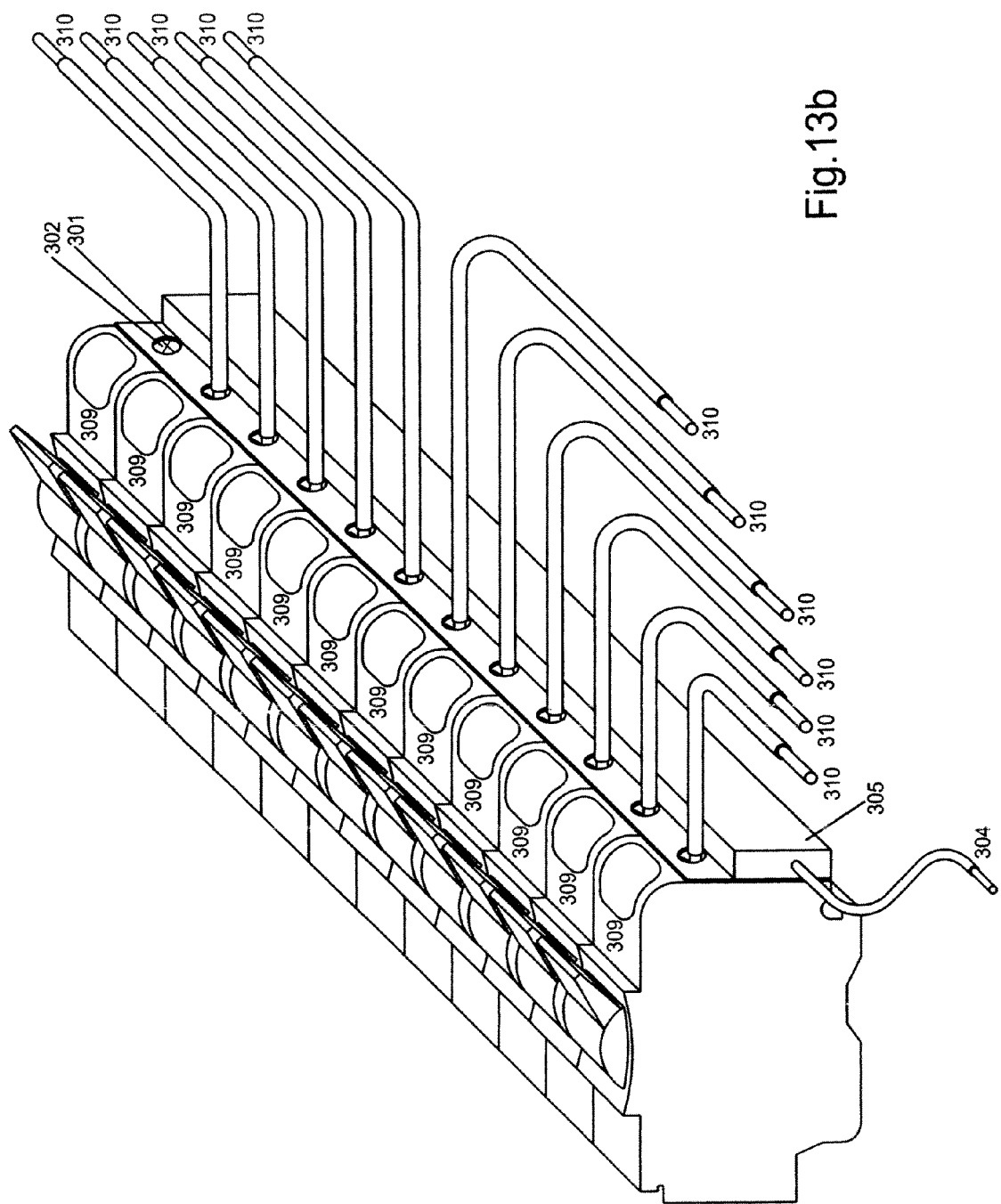
FIG. 13b is an illustration of an embodiment of FIG. 13a in line with circuit breakers using galvanic contact.

FIGS. 12a and 12b show an embodiment of a device 300 of the invention for use with a switch, circuit breaker or other electrical component having a line wire 310 (shown in FIG. 13b). The circuitry is as described above in connection with the plug embodiment of FIG. 4. In this case a galvanic contact 301 may extend into opening 302 through which the load conductor (line wire 310, black) is inserted before it is fastened to the electrical load sought to be monitored. The circuit from which the current through the line wire 310 is measured is closed by wire 304 connected to the common conductor (white). The current-measuring circuitry in the device 300 may be powered by galvanic contact 301, or alternately powered by separate wire 306 connected to the mains power supply (for example to the same line conductor 310 passing through opening 302).

A 'ganged' version of the device 300 is shown in FIG. 13a, in which a single housing strip 305 contains a plurality of devices 300 (12 in FIG. 13) of independent current-measuring circuits. This for example could be configured for use in a fuse box or circuit breaker box, with the openings 302 aligned to coincide with the line clamps of adjacent fuse blocks or circuit breakers, or with the mains contacts of adjacent fuse blocks or circuit breakers 309 (see for example FIG. 13b) An alternate arrangement is shown in FIG. 13c wherein the galvanic contact is replaced by conductor 306.

The device of the invention can, instead of or in addition to providing a visual display, be equipped with means for communicating with a remote device. FIG. 7 shows by way of example a communication block 140 which may comprise a signal transmitter or transceiver 143 located inside the energy monitoring device 100 or 300 and electrically connected to microcontroller 181, ASIC 182 or other electronics, for transmitting data to a remote location; and a signal receiver or transceiver 144 located outside the energy monitoring device 100 or 300 for receiving signals from transmitter or transceiver 143 and optionally converting the signal into a suitable format for communication with intercommunication device 141 (for example, a PC connected to a network such as the Internet). The communications block 140 could for example enable communication unidirectionally from a device 100 or 300 to other equipment 145; unidirectionally to device 100 or 300 from other equipment 145; or bi-directionally to and from device 100 or 300 from and to other equipment 145.

The intercommunication means 141 between parts 143 and 144 of communication structure 140 could include (but is not limited to) direct connection via contacts on the module 100 e.g. a USB connection; an optical transceiver (for example Infrared) on the module 100; transmission via the mains power lines using an X-10 or other suitable protocol; a magnetic transducer; an electric transducer; and/or a radio frequency transceiver. The other equipment 145 may include (but is not limited to) a personal computer; and energy management system; a data logger; and/or a utility monitoring system.

Figure 5:
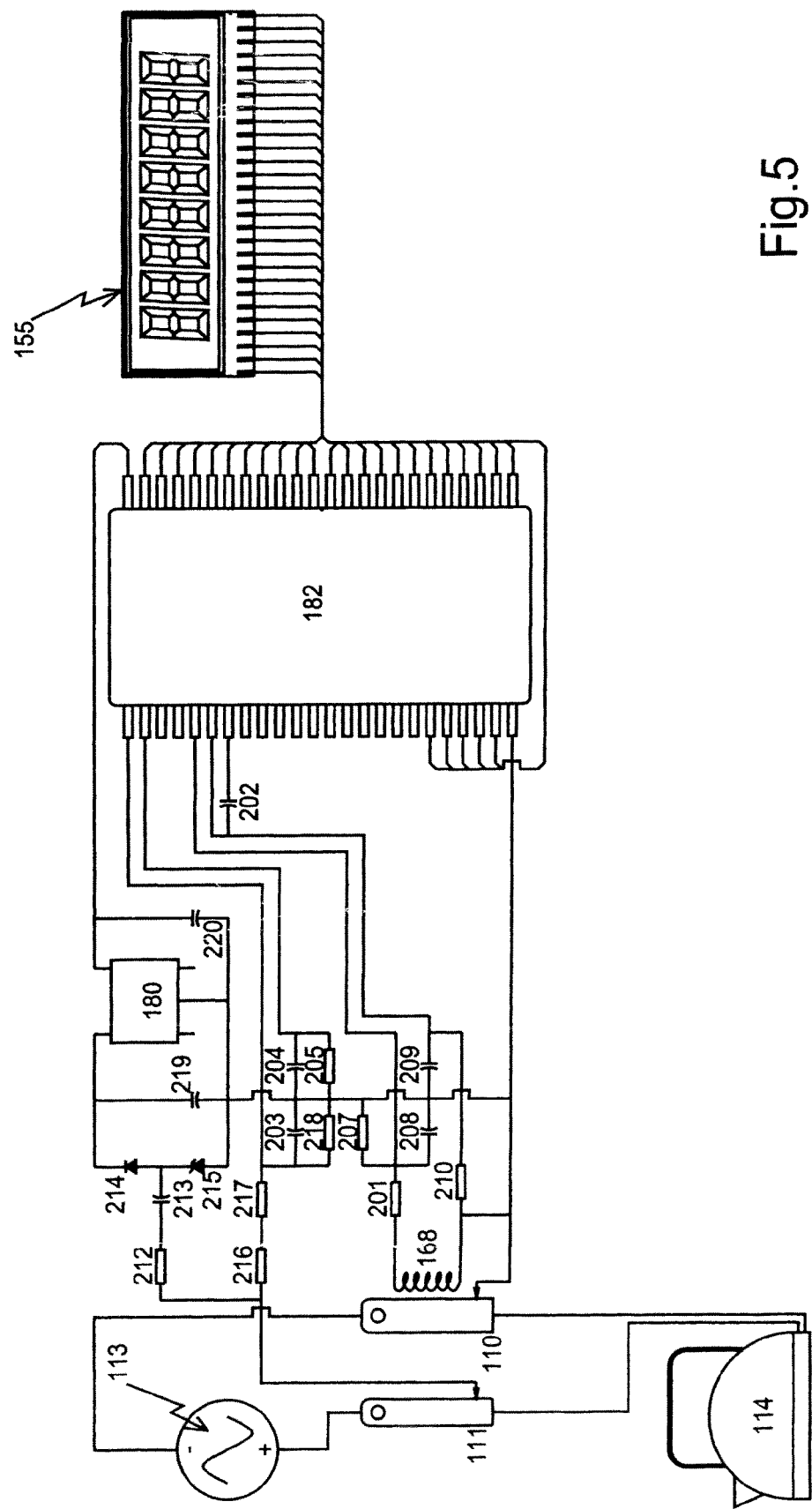
FIG. 5 is an electrical circuit schematic of an embodiment of the invention utilizing an ASIC as the means of converting the signals to displayed information and including connections to a power supply (utility) and an electrical load.
Figure 6:
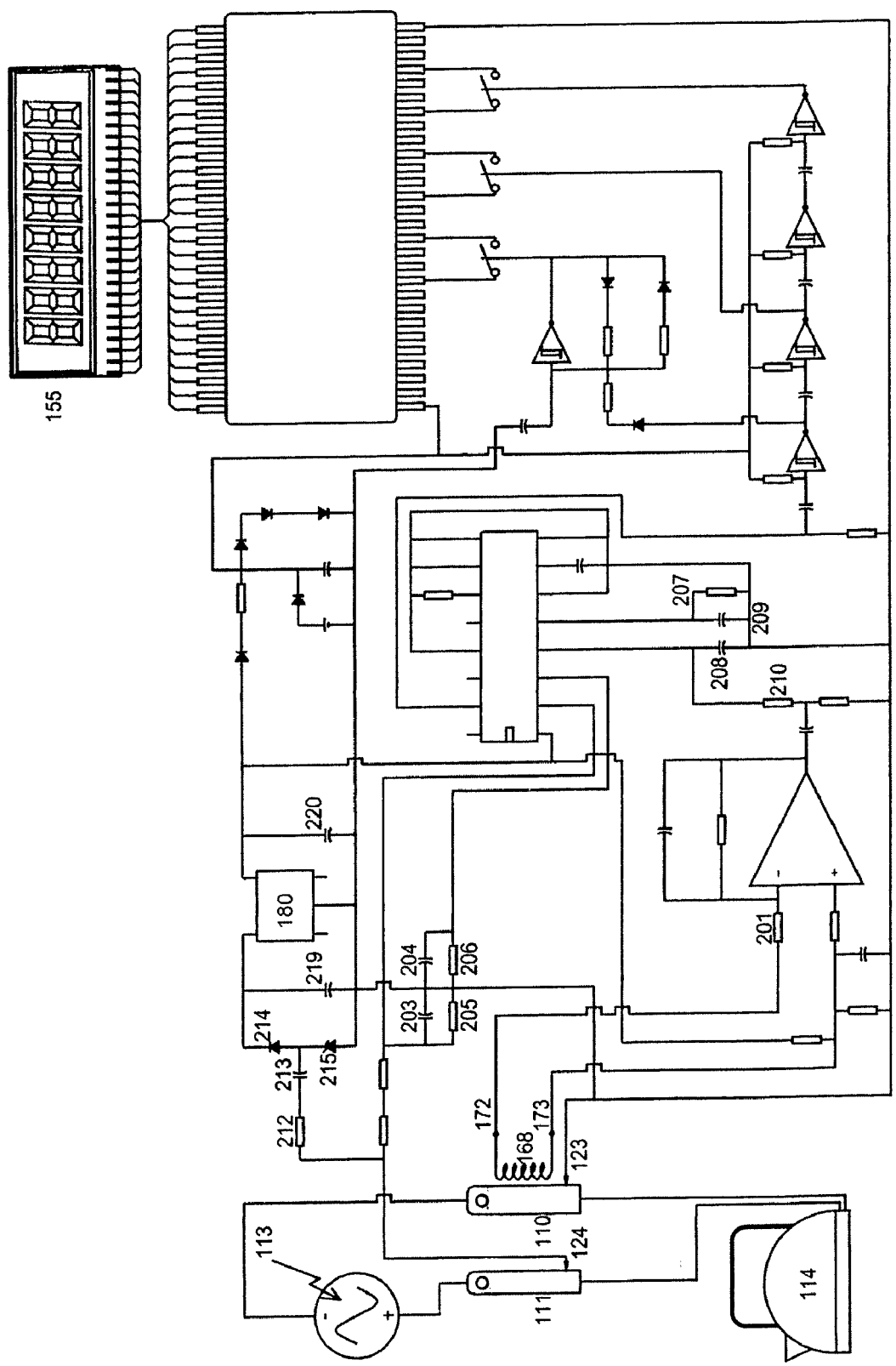
FIG. 6 is an electrical circuit schematic of an embodiment of the invention utilizing various electronic circuit components as the means of converting the signals to displayed information and including connections to a power supply (utility) and an electrical load.
Figure 14:
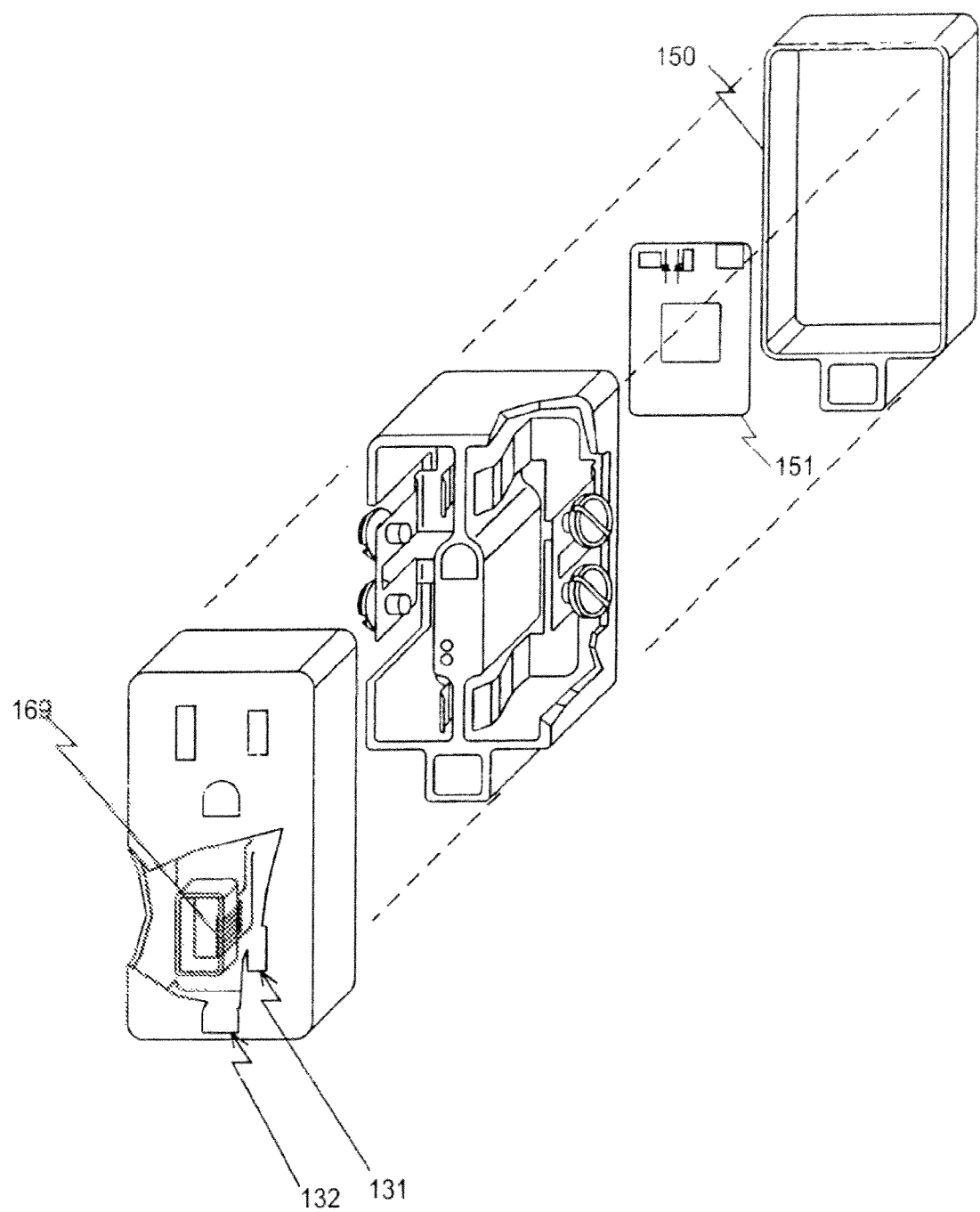
FIG. 14 is a schematic perspective view of an embodiment of the device built into a receptacle of a power outlet.
Figure 15:
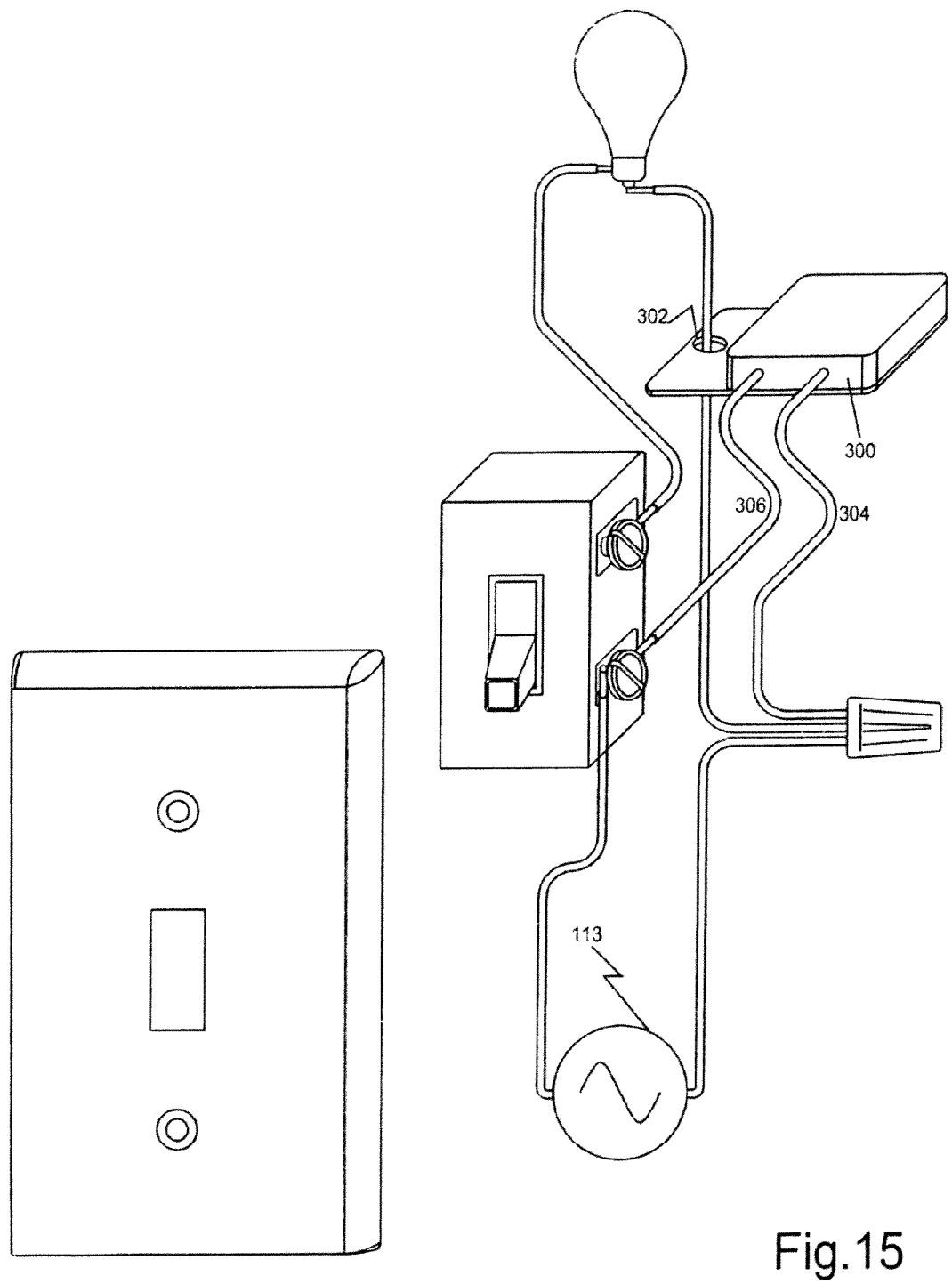
FIG. 15 is a schematic perspective view of the embodiment of FIG. 12 being used to monitor power in a light switch box.
Figure 16:
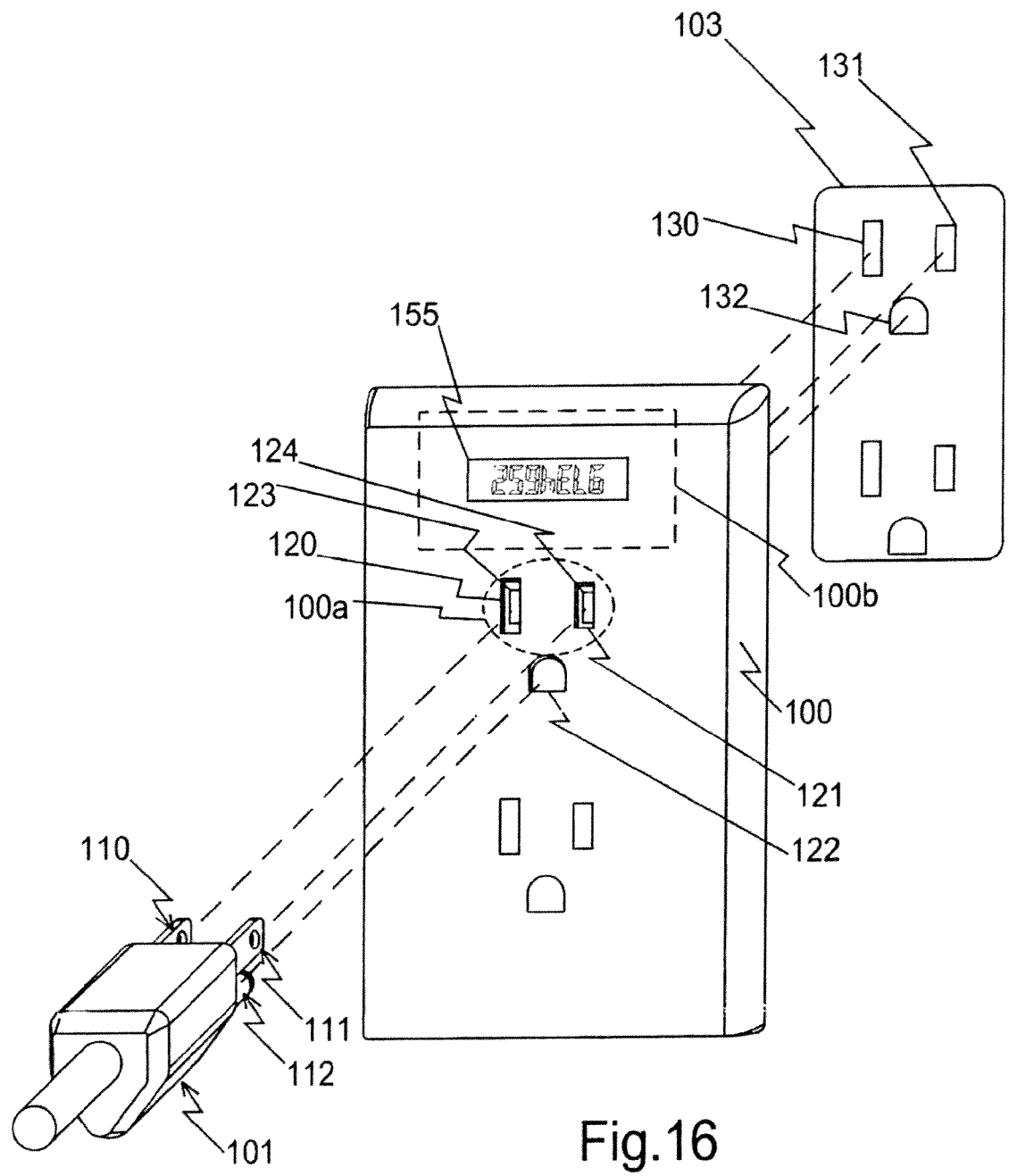
FIG. 16 is a schematic perspective view of an embodiment of the device built into a cover plate of a power outlet.
Figure 17:
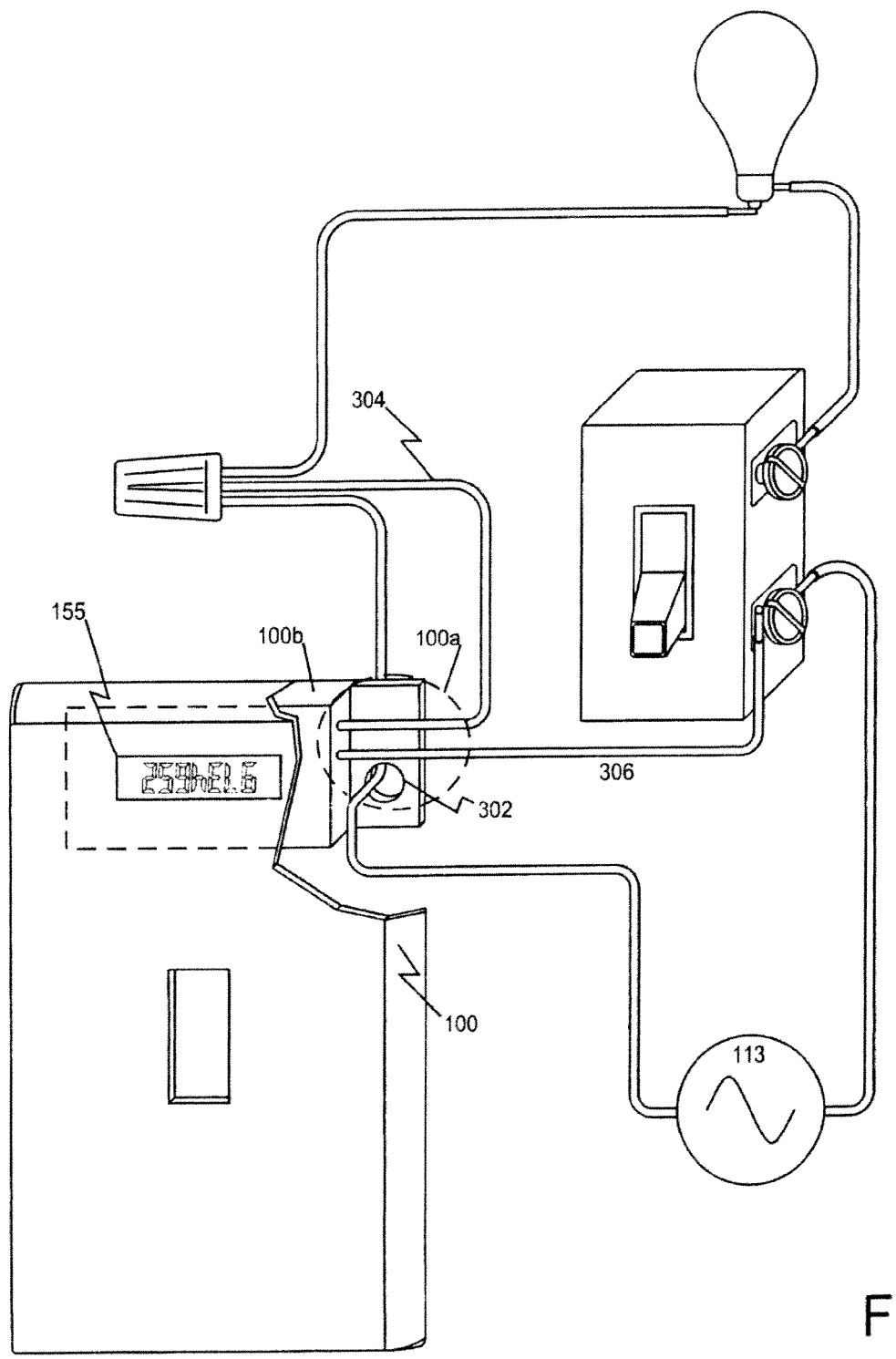
FIG. 17 is a schematic perspective view of an embodiment of the device built into a cover plate of a power outlet.

Alternative embodiments within the scope of the present invention could include an embodiment with the electronics, measuring and display in a wall plate with the plug blades 110, 111 going through a membrane across the receptacle portion an embodiment with the electronics and measuring integral with the power cord plug or cap 101, which may or may not include a display; an embodiment with the electronics inside the receptacle structure in a manner similar to conventional ground fault interrupters, which may or may not include a display, an example of which is shown in FIG. 14; an embodiment which has no galvanic contacts for electronic power, wherein the electronics are powered by a suitable battery; an embodiment wherein there are no galvanic contacts and the voltage measurement is achieved via capacitive coupling (so the device has no direct electrical connection to the utility); an embodiment with the electronics powered by a current transformer, wherein when current is being drawn by the load, the current transformer (through suitable electronics) will power the device; and/or an embodiment similar to that shown in FIG. 5 with the electronics powered by a current transformer.

The means for communicating with a remote device, for example a wireless transmitter, can enable the transmission of signals conveying monitoring information to an administrator which can log, analyze and return information relating to power usage at the premises. In one preferred embodiment, the administrator maintains a web-based interface that can receive information from the various monitoring devices distributed about a premises and return to the user, for example via a browser based web interface, values indicating current and projected electrical usage; comparisons with other similar users; the cost of running specific models of appliances (based on bench marks provided by experimentation, aggregation or directly from the manufacturers); and any other information that might be of interest to the user.

Such a web based interface could further point out anomalies in electrical usage at the premises; or, based on electrical cost fluctuations, recommend optimal times for running specific appliances to minimize the cost of electrical usage. Such a web based interface could thus serve as a general electrical usage efficiency feedback tool, which would allow the user to maximize the efficiency of the usage of electricity, even factoring in such things as the heat given off by various appliances in the premises (and the attendant cost savings that might result from heat sources within the premises), etc.

Where the device includes a means for communicating with such an administration system, a display on the device itself will become optional because a user could refer to their browser-based system for information relating to all monitoring devices distributed throughout their premises. In these embodiments, because it does not have to be visible to the user, the monitoring device can be built inside the receptacle cover plate, into the "cap" of an appliance plug 101, into the receptacle 103 (for example a duplex receptacle) or light switch itself, or in any other convenient location.

In addition to or alternately, a user might enter information read from various devices having displays to an administrator or a website of a community of users. The user may also include information regarding the environment of the appliance being monitored for example the type, manufacturer and model, the number of household occupants, the location within the household and the household address. Such an administrator or website could be maintained by the manufacturer or provider of the device. The data can be time-stamped, allowing the administrator to create an electrical usage profile for users.

Figure 3E:
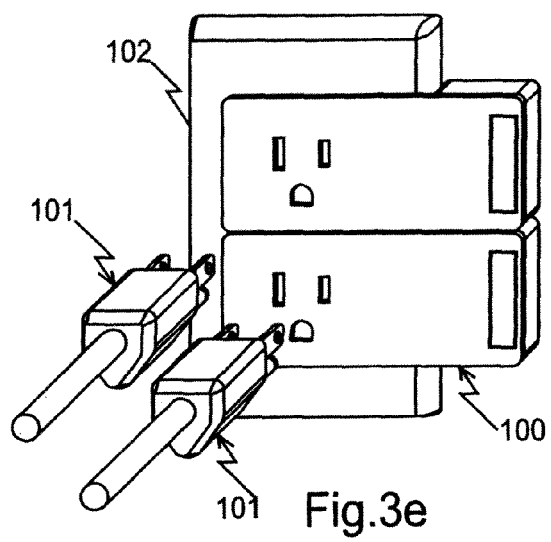
Figure 3F:
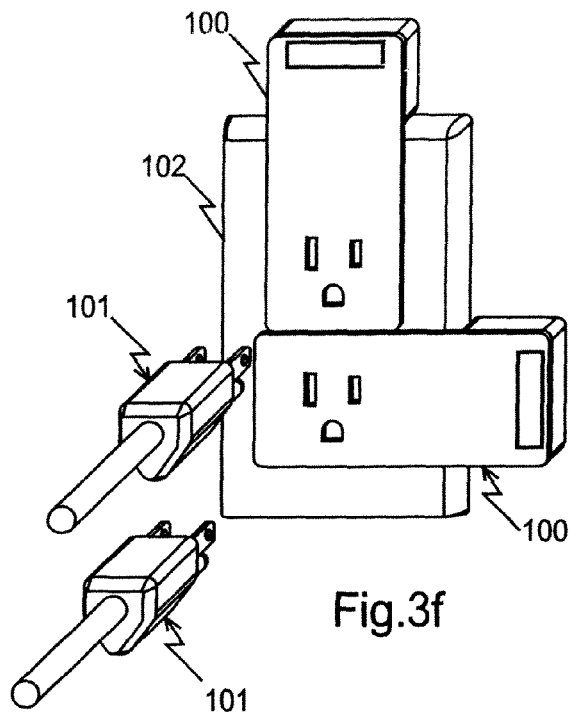
Figure 3G:
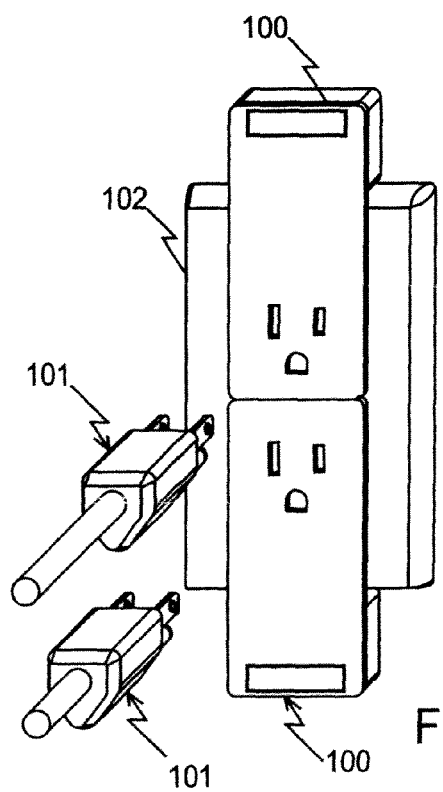
Figure 3H:
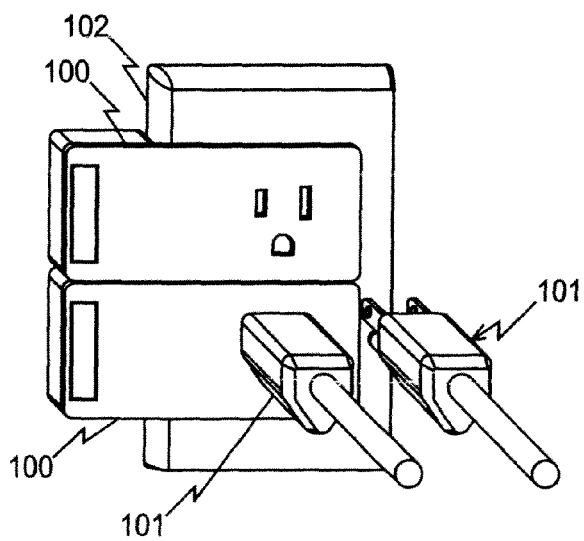

The preferred embodiment of the device also allows for participation and sponsorship by institutions and organizations. For example, a utility company serving a particular region could offer devices of the invention as a promotional giveaway, and could include their name and/or logo or other identifying indicia on the visible portion of the device, as illustrated in FIG. 3a. Alternatively, organizations or institutions may pay a fee to have their name, logo or other identifying indicia printed on the visible portions of the device.

Various embodiments of the invention having been thus described with reference to preferred embodiments, it will be appreciated by those skilled in the art that adaptations and modifications may be made without departing from the scope of the invention.

We claim:

1. An electric energy monitor device for measuring the electrical energy usage of an electrical load powered by load conductors connected to a power source, the electrical load having a line cord comprising the load conductors, the line cord terminating in a plug having blades terminating the load conductors for connection to an electrical receptacle coupled to the power source, the device comprising:
   a body, the body being configured to allow at least one blade to pass through at least one opening in the body into the electrical receptacle,
   at least one current sensor for detecting a level of current, the current sensor being housed in the body and the current sensor comprising an inductor having at least one complete electrical turn in inductive communication with the load conductor when the blade extends through the opening in the body into the electrical receptacle such that an output voltage of the current sensor is a function of the level of current in the load conductor,
   a controller for receiving signals from the current sensor, and transmitting data either to a display for displaying data relating to electrical energy usage of the load, or to a remote data processing device for recording data relating to electrical energy usage of the load, or to both, the controller being housed in the body.

2. The device as defined in claim 1, wherein the current sensor comprises an integrator in electrical communication with the inductor such that the output voltage of the current sensor is a direct function of the level of current in the load conductor.

3. The device as defined in claim 1 further comprising at least one voltage sensor for detecting a level of voltage between at least two load conductors which have an electrical potential drop representing the voltage drop across the load, wherein the body houses the voltage sensor and is configured to allow at least two blades terminating the at least two load conductors to respectively extend through at least two openings in the body into the electrical receptacle, the blades when extending through the at least two openings in the body being in conductive communication with voltage sensing conductors coupled to the voltage sensor, to sense a potential drop across the load.

4. The device as defined in claim 3 wherein the controller calculates power usage based on the detected level of current and level of voltage drop.

5. The device as defined in claim 4, wherein the body is configured as a cover plate for the electrical receptacle.

6. The device as defined in claim 4 configured to be contained within the plug of the line cord.

7. The device as defined in claim 4 to be contained within the electrical receptacle.

8. The device as defined in claim 4, wherein a space within the coil of the current sensor is filled with a ferromagnetic material or non-ferromagnetic material.

9. The device as defined in claim 3 wherein the voltage sensor is coupled to the load conductors by galvanic contacts.

10. The device as defined in claim 3 wherein the voltage sensor is capacitively coupled to the load conductors.

11. The device as defined in claim 3 for a multi-phase load having N phases and N conductors wherein the device comprises N−1 voltage sensors.

12. The device as defined in claim 3 for a multi-phase load having N phases and N+1 conductors wherein the device comprises N voltage sensors.

13. The device as defined in claim 3 wherein either the time the device is powered or the time that a load characteristic such as current exceeds some preset minimum, or both, is monitored and displayed.

14. The device as defined in claim 3 wherein at least one energy usage characteristic is recorded in non-volatile memory.

15. The device as defined in claim 1 wherein the current sensor operates using the Hall Effect.

16. The device as defined in claim 1 wherein the current sensor operates using a ferro-resistive principle.

17. The device as defined in claim 1 wherein the current sensor operates using a ferro-capacitive principle.

18. The device as defined in claim 1 wherein the current sensor comprises a fluxgate sensor.

19. The device as defined in claim 1 wherein the display means is integral to the device.

20. The device as defined in claim 1 wherein the display is located remotely from the device.

21. The device as defined in claim 20 wherein the display comprises more than one remote display element.

22. The device as defined in claim 1 wherein the display comprises an integral display element and at least one remote display element.

23. The device as defined in claim 1 for a multi-phase load having N phases and N conductors wherein the device comprises N−1 current sensors.

24. The device as defined in claim 1 for a multi-phase load having N phases and N+1 conductors wherein the device comprises N current sensors.

25. The device as defined in claim 1, wherein the at least one electrical turn of the inductor is wound on a core that does not encircle the blade when the blade is extended through the opening in the body.

26. An electric energy monitor device for measuring the electrical energy usage of an electrical load powered by load conductors connected to a power source via a switch, the device comprising:
   a body, the body being configured as a cover plate for the switch box and configured to allow at least one load conductor to pass through at least one opening in the body to a switch, at least one current sensor for detecting a level of current, the current sensor being housed in the body and the current sensor comprising an inductor having at least one complete electrical turn in inductive communication with the load conductor extending through the opening in the body to the switch such that an output voltage of the current sensor is a function of the level of current in the load conductor, a controller for receiving signals from the current sensor, and transmitting data either to a display for displaying data relating to electrical energy usage of the load, or to a remote data processing device for recording data relating to electrical energy usage of the load, or to both, the controller being housed in the body.

27. A current monitoring device for measuring a current drawn by an electrical load powered by load conductors connected to a power source, the electrical load having a line cord comprising the load conductors, the line cord terminating in a plug having blades terminating the load conductors for connection to an electrical receptacle coupled to the power source, the device comprising:

a body, the body being configured to allow at least one blade to pass through at least one opening in the body into the electrical receptacle, at least one current sensor for detecting a level of current, the current sensor being housed in the body and the current sensor comprising an inductor having at least one complete electrical turn in inductive communication with the load conductor when the blade extends through the opening in the body into the electrical receptacle such that an output voltage of the current sensor is a function of the level of current in the load conductor, a controller for receiving signals from the current sensor, and transmitting data either to a display for displaying data relating to current drawn by the load, or to a remote data processing device for recording data relating to current drawn by the load, or to both, the controller being housed in the body.

28. The device as defined in claim 27, wherein the at least one electrical turn of the inductor is wound on a core that does not encircle the blade when the blade is extended through the opening in the body.

29. A voltage monitoring device for measuring a voltage of an electrical load powered by load conductors connected to a power source, the electrical load having a line cord comprising the load conductors, the line cord terminating in a plug having blades terminating the load conductors for connection to an electrical receptacle coupled to the power source, the device comprising a body, the body being configured to allow at least two blades to pass through at least two openings in the body into the electrical receptacle, at least one voltage sensor for detecting a level of voltage between at least two load conductors which have an electrical potential drop representing the voltage drop across the load, wherein the body houses the voltage sensor and is configured to allow at least two blades terminating the at least two load conductors to respectively extend through the at least two openings in the body, the blades when extending through the at least two openings in the body being in conductive communication with voltage sensing conductors coupled to the voltage sensor, to sense a potential drop across the load, and a controller for receiving signals from the voltage sensor, and transmitting data either to a display for displaying data relating to the voltage of the load, or to a remote data processing device for recording data relating to the voltage of the load, or to both, the controller being housed in the body.

30. A method of measuring electric power used by an electrical load powered by load conductors connected to a power source, the electrical load having a line cord comprising the load conductors, the line cord terminating in a plug having blades terminating the load conductors for connection to an electrical receptacle coupled to the power source, via a device comprising a body, the body being configured to allow at least one blade to pass through at least one opening in the body into the electrical receptacle, at least one current sensor for detecting a level of current, the current sensor being housed in the body and the current sensor comprising an inductor having at least one complete electrical turn in inductive communication with the load conductor when the blade extends through the opening in the body into the electrical receptacle such that an output voltage of the current sensor is a function of the level of current in the load conductor, and a controller housed in the body, the method comprising the steps of:

a. passing at least one load conductor through the body to the power source, b. receiving at the controller signals from the current sensor, and c. transmitting data from the controller either to a display for displaying data relating to electrical energy usage of the load, or to a remote data processing device for recording data relating to electrical energy usage of the load, or to both.

31. The device as defined in claim 30, wherein the at least one electrical turn of the inductor is wound on a core that does not encircle the blade when the blade is extended through the opening in the body.

* * * * *